United States Patent
Mayuzumi et al.

(10) Patent No.: US 10,854,751 B2
(45) Date of Patent: *Dec. 1, 2020

(54) SEMICONDUCTOR DEVICE HAVING CURVED GATE ELECTRODE ALIGNED WITH CURVED SIDE-WALL INSULATING FILM AND STRESS-INTRODUCING LAYER BETWEEN CHANNEL REGION AND SOURCE AND DRAIN REGIONS

(71) Applicant: Sony Corporation, Tokyo (JP)

(72) Inventors: Satoru Mayuzumi, Tokyo (JP); Hitoshi Wakabayashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/706,176

(22) Filed: Dec. 6, 2019

(65) Prior Publication Data

US 2020/0119194 A1  Apr. 16, 2020

Related U.S. Application Data

(63) Continuation of application No. 16/296,448, filed on Mar. 8, 2019, now Pat. No. 10,535,769, which is a (Continued)

(30) Foreign Application Priority Data

Jun. 12, 2009 (JP) .................................. 2009-140930

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/26513* (2013.01); *H01L 29/0847* (2013.01);
(Continued)

(58) Field of Classification Search
CPC combination set(s) only.
See application file for complete search history.

(56) References Cited

U.S. PATENT DOCUMENTS

| 6,348,385 B1 | 2/2002 | Cha et al. |
| 6,921,913 B2 | 7/2005 | Yeo et al. |

(Continued)

FOREIGN PATENT DOCUMENTS

| CN | 1822392 | 8/2006 |
| JP | 2001-015749 | 1/2001 |

(Continued)

OTHER PUBLICATIONS

Definition of Underneath. Random House Kernerman Webster's College Dictionary. (2010). Retrieved Jan. 5, 2015 from http://www.thefreedictionary.com/underneath.

(Continued)

*Primary Examiner* — Michael Jung
(74) *Attorney, Agent, or Firm* — Dentons US LLP

(57) ABSTRACT

A semiconductor device including a channel region formed in a semiconductor substrate; a source region formed on one side of the channel region; a drain region formed on the other side of the channel region; a gate electrode formed on the channel region with a gate insulating film therebetween; and a stress-introducing layer that applies stress to the channel region, the semiconductor device having a stress distribution in which source region-side and drain region-side peaks are positioned between a pn junction boundary of the channel region and the source region and a pn junction boundary of the channel region and the drain region.

20 Claims, 12 Drawing Sheets

Related U.S. Application Data continuation of application No. 15/907,936, filed on Feb. 28, 2018, now Pat. No. 10,269,961, which is a continuation of application No. 15/416,739, filed on Jan. 26, 2017, now Pat. No. 9,947,790, which is a continuation of application No. 15/091,146, filed on Apr. 5, 2016, now Pat. No. 9,601,622, which is a continuation of application No. 14/819,115, filed on Aug. 5, 2015, now Pat. No. 9,337,305, which is a continuation of application No. 12/783,248, filed on May 19, 2010, now Pat. No. 9,153,663.

(51) Int. Cl.

| | | |
|---|---|---|
| *H01L 29/66* | (2006.01) | |
| *H01L 29/423* | (2006.01) | |
| *H01L 29/51* | (2006.01) | |
| *H01L 29/49* | (2006.01) | |
| *H01L 21/265* | (2006.01) | |
| *H01L 29/16* | (2006.01) | |
| *H01L 29/161* | (2006.01) | |
| *H01L 29/165* | (2006.01) | |

(52) U.S. Cl.
CPC .......... *H01L 29/161* (2013.01); *H01L 29/165* (2013.01); *H01L 29/1608* (2013.01); *H01L 29/42368* (2013.01); *H01L 29/495* (2013.01); *H01L 29/4975* (2013.01); *H01L 29/517* (2013.01); *H01L 29/6659* (2013.01); *H01L 29/66545* (2013.01); *H01L 29/7833* (2013.01); *H01L 29/7843* (2013.01); *H01L 29/665* (2013.01); *H01L 2924/0002* (2013.01)

(56) References Cited

U.S. PATENT DOCUMENTS

| | | | |
|---|---|---|---|
| 7,224,021 B2 | 5/2007 | Chidambarrao et al. | |
| 7,274,084 B2 | 9/2007 | Chidambarrao | |
| 7,354,838 B2 | 4/2008 | Kammler et al. | |
| 7,554,110 B2 | 6/2009 | Yu et al. | |
| 8,574,979 B2* | 11/2013 | Sridhar | H01L 21/823807 257/E21.611 |
| 9,337,305 B2 | 5/2016 | Mayuzumi et al. | |
| 9,698,054 B2 | 7/2017 | Cheng et al. | |
| 2006/0202278 A1 | 9/2006 | Shima et al. | |
| 2006/0220113 A1 | 10/2006 | Tamura et al. | |
| 2006/0234433 A1 | 10/2006 | Luan et al. | |
| 2006/0286729 A1* | 12/2006 | Kavalieros | H01L 21/28079 438/183 |
| 2007/0132032 A1 | 6/2007 | Teo et al. | |
| 2007/0196991 A1 | 8/2007 | Nandakumar et al. | |
| 2007/0238242 A1 | 10/2007 | Ting et al. | |
| 2007/0252205 A1 | 11/2007 | Hoentschel et al. | |
| 2008/0006818 A1 | 1/2008 | Luo et al. | |
| 2008/0197412 A1 | 8/2008 | Zhang et al. | |
| 2008/0197426 A1 | 8/2008 | Okazaki | |
| 2008/0230805 A1 | 9/2008 | Hokazone et al. | |
| 2008/0237709 A1 | 10/2008 | Chidambarrao et al. | |
| 2008/0242037 A1 | 10/2008 | Sell | |
| 2008/0265256 A1 | 10/2008 | Lin et al. | |
| 2008/0277740 A1 | 11/2008 | Tateshita | |
| 2009/0014813 A1 | 1/2009 | Chao et al. | |
| 2009/0032841 A1 | 2/2009 | Eller et al. | |
| 2009/0098665 A1 | 4/2009 | Bu et al. | |
| 2009/0124056 A1 | 5/2009 | Chen et al. | |
| 2009/0191679 A1* | 7/2009 | Ouyang | H01L 21/823807 438/276 |
| 2009/0239347 A1 | 9/2009 | Ting et al. | |
| 2009/0242995 A1 | 10/2009 | Suzuki et al. | |
| 2010/0001317 A1* | 1/2010 | Chen | H01L 21/26506 257/192 |
| 2010/0025771 A1 | 2/2010 | Hoentschel et al. | |
| 2010/0059833 A1* | 3/2010 | Yu | H01L 21/823807 257/410 |
| 2010/0081245 A1* | 4/2010 | Yang | H01L 29/66636 438/299 |
| 2010/0109045 A1 | 5/2010 | Liu et al. | |
| 2010/0258868 A1 | 10/2010 | Yin et al. | |
| 2012/0032240 A1 | 2/2012 | Mayuzumi | |

FOREIGN PATENT DOCUMENTS

| | | |
|---|---|---|
| JP | 2002-164535 | 6/2002 |
| JP | 2004-039762 | 2/2004 |
| JP | 2005-057301 | 3/2005 |
| JP | 2006-332337 | 12/2006 |
| JP | 2007-329477 | 6/2007 |
| JP | 2007-227851 | 9/2007 |
| JP | 2007-300103 | 11/2007 |
| JP | 2008-263168 | 1/2008 |
| JP | 2008-527745 | 7/2008 |
| JP | 2008-218725 | 9/2008 |
| JP | 2008-235568 | 10/2008 |
| JP | 2008-282901 | 11/2008 |
| JP | 2008-539591 | 11/2008 |
| JP | 2009-500823 | 1/2009 |
| JP | 2009-506574 | 2/2009 |
| JP | 2009-094225 | 4/2009 |
| JP | 2010-505267 | 2/2010 |
| JP | 2010-520651 | 6/2010 |
| JP | 2010-527153 | 8/2010 |
| JP | 2010-520651 | 10/2010 |
| JP | 2010-538460 | 12/2010 |
| WO | WO/2009/032230 | 3/2009 |

OTHER PUBLICATIONS

Kosemura, D., et al. "Characterization of Strain for High Performance MOSFETs", 2007.

Japanese Patent Office Action issued in corresponding JP Application No. 2014-255292 dated Jan. 5, 2016.

Japanese Patent Office Action issued in connection with corresponding JP Application No. 2014-255292 dated Jul. 5, 2016.

* cited by examiner

FIG.4
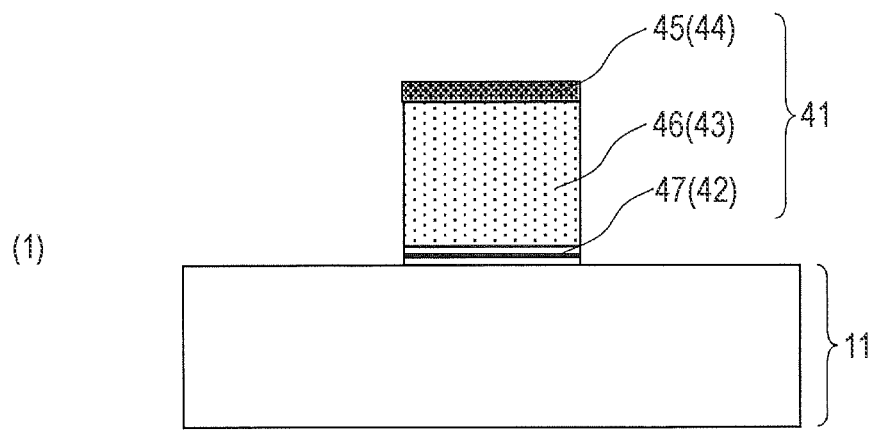
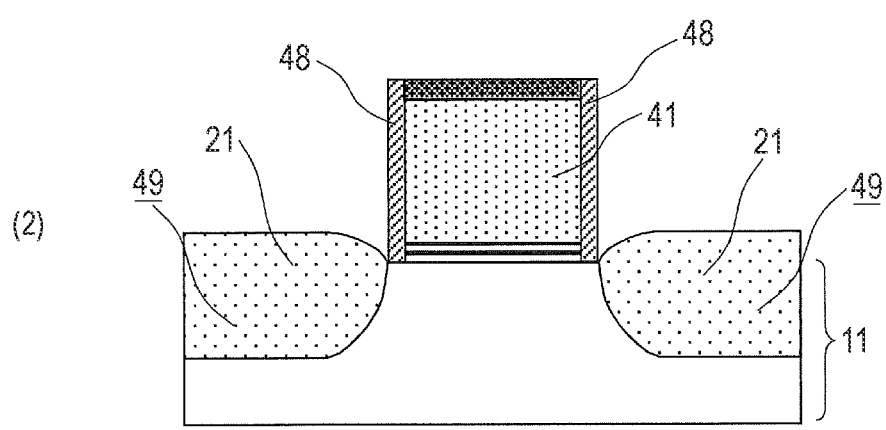
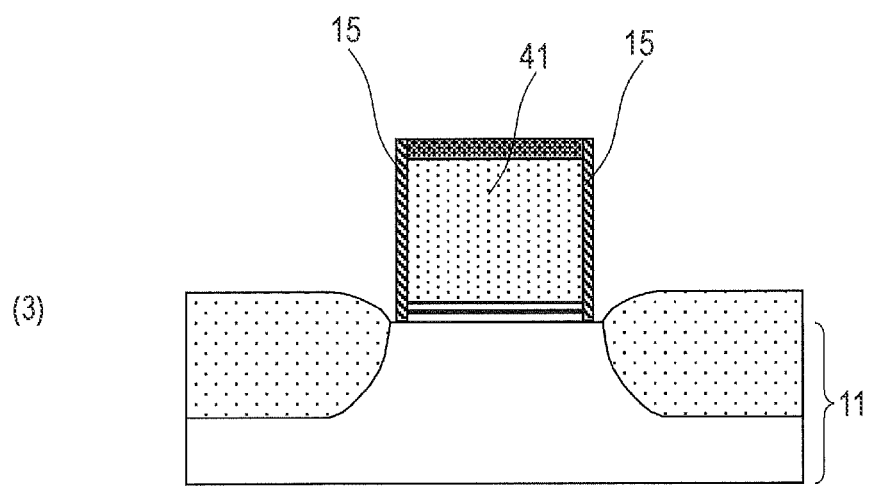

FIG.6
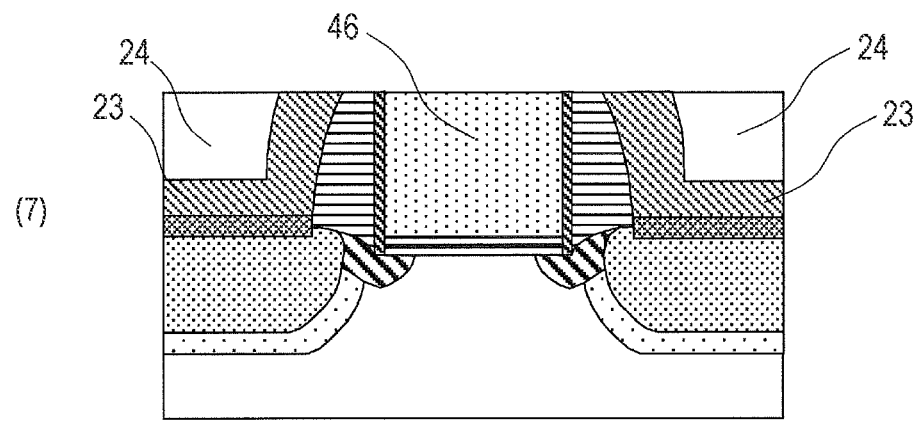
(7)
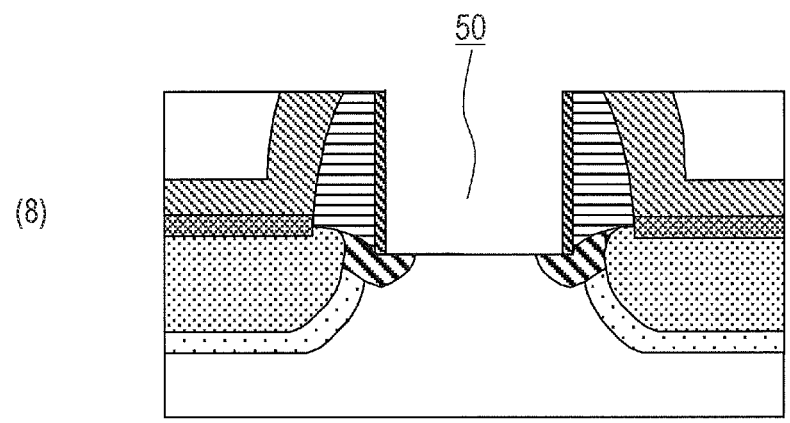
(8)
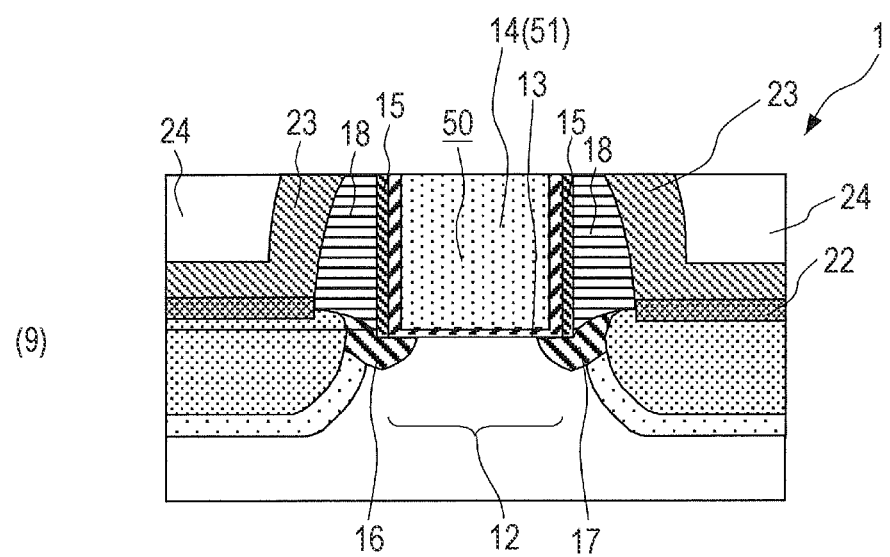
(9)

FIG.7
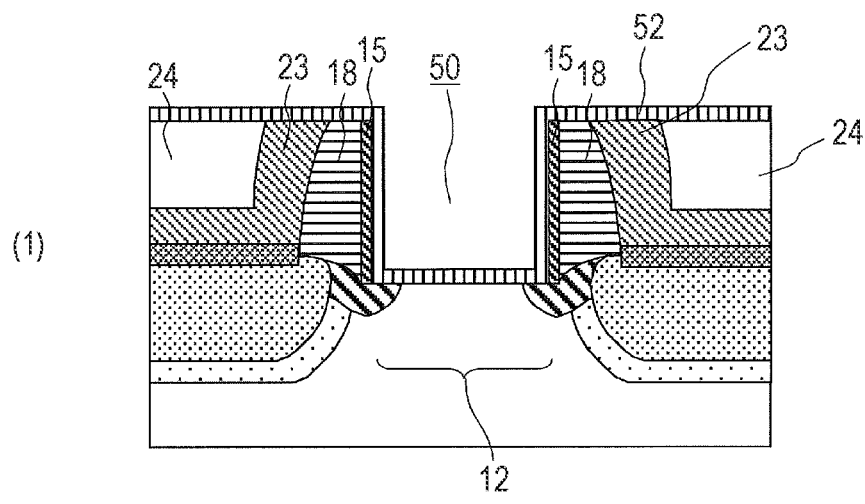
(1)
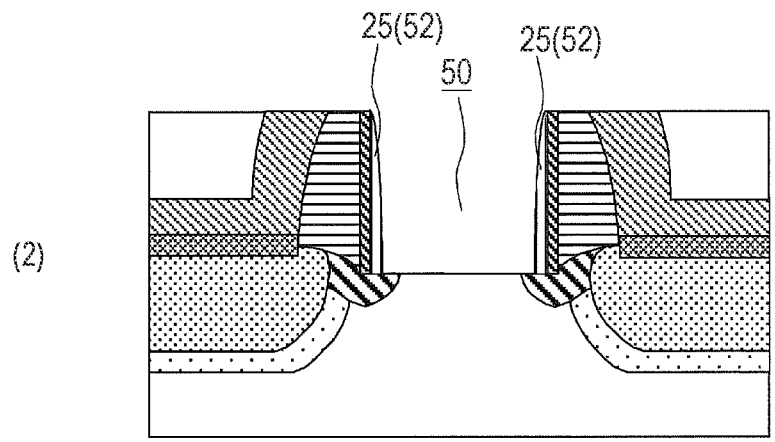
(2)
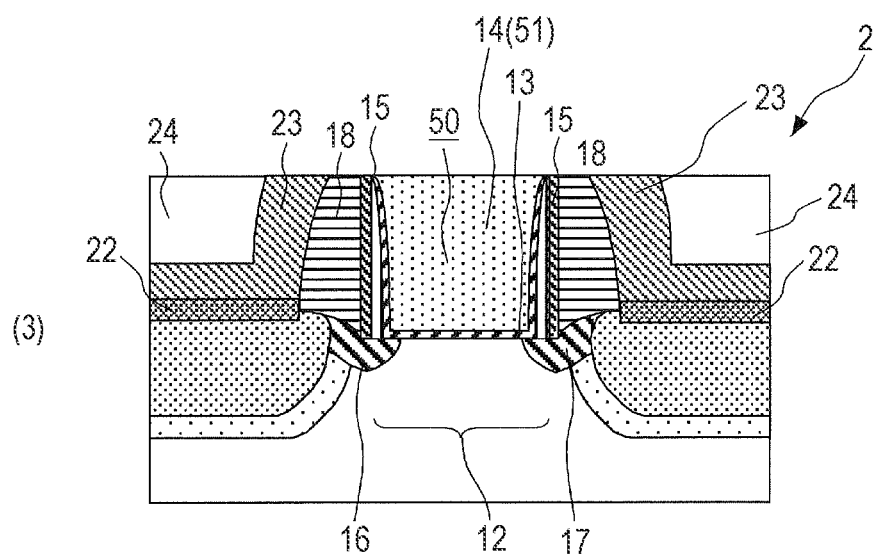
(3)

FIG.9
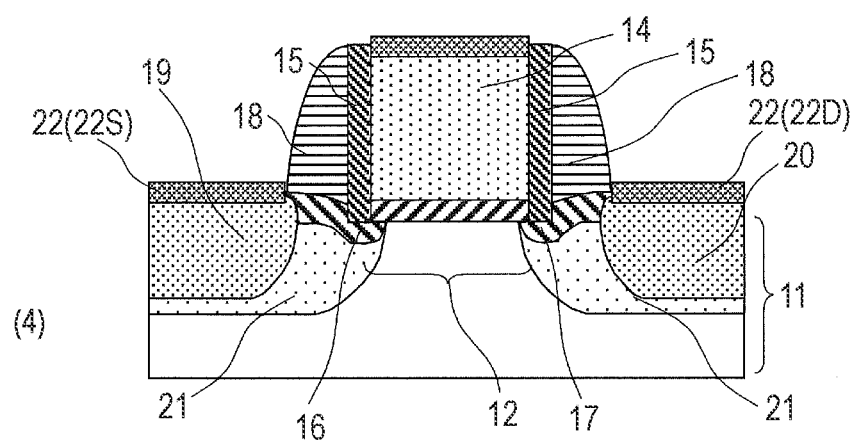
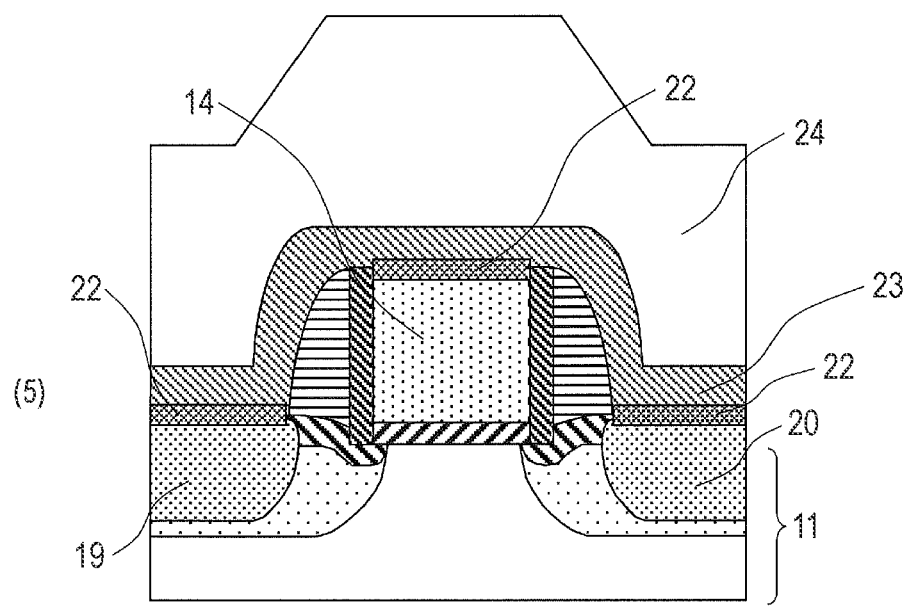
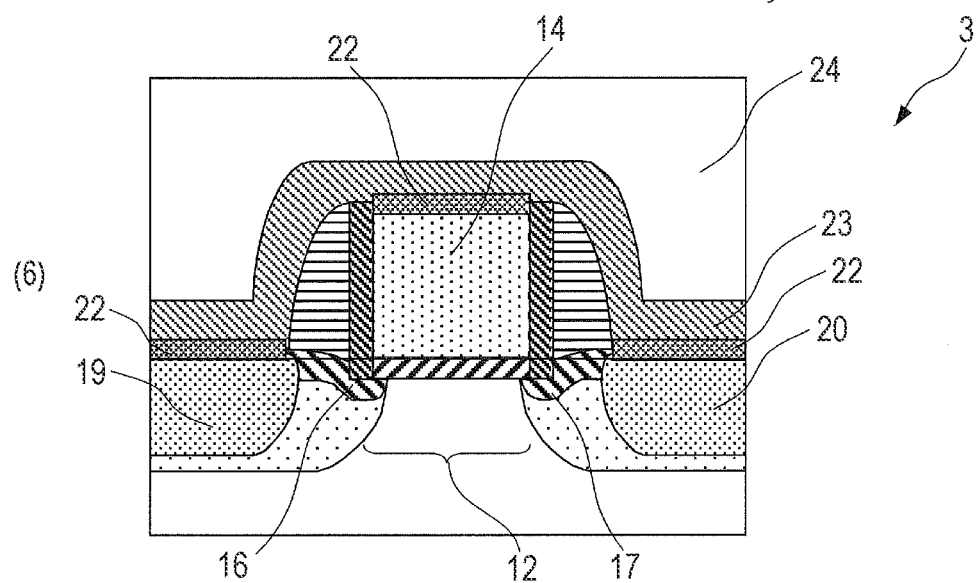

FIG.12
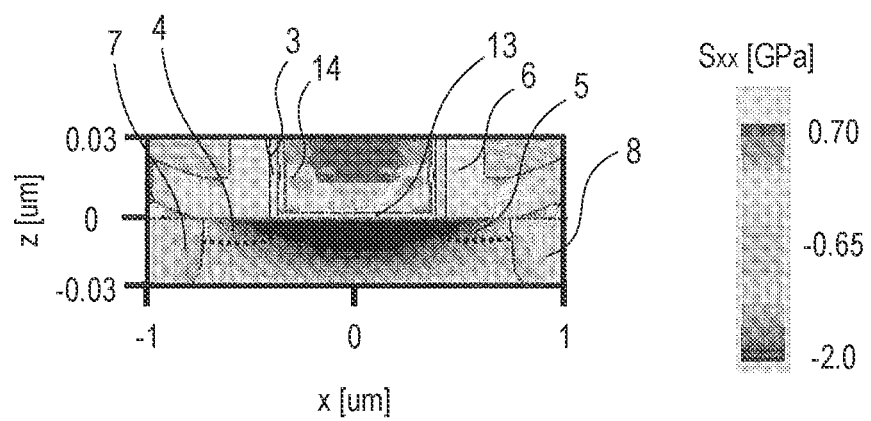
(1)
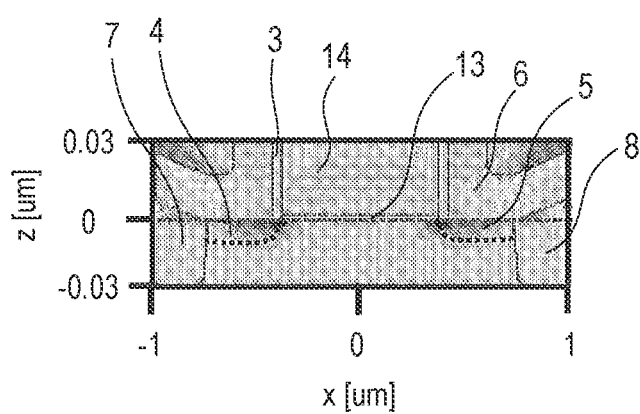
(2)

SEMICONDUCTOR DEVICE HAVING CURVED GATE ELECTRODE ALIGNED WITH CURVED SIDE-WALL INSULATING FILM AND STRESS-INTRODUCING LAYER BETWEEN CHANNEL REGION AND SOURCE AND DRAIN REGIONS

RELATED APPLICATION DATA

This application is a continuation of U.S. patent application Ser. No. 16/296,448 filed Mar. 8, 2019, which is a continuation of U.S. patent application Ser. No. 15/907,936 filed Feb. 28, 2018, now U.S. Pat. No. 10,296,961 issued Apr. 23, 2019, which is a continuation of U.S. patent application Ser. No. 15/416,739 filed Jan. 26, 2017, now U.S. Pat. No. 9,947,790 issued Apr. 17, 2018, which is a continuation of U.S. patent application Ser. No. 15/091,146 filed Apr. 5, 2016, now U.S. Pat. No. 9,601,622 issued Mar. 21, 2017, which is a continuation of U.S. patent application Ser. No. 14/819,115 filed Aug. 5, 2015, now U.S. Pat. No. 9,337,305 issued May 10, 2016, which is a continuation of U.S. patent application Ser. No. 12/783,248 filed May 19, 2010, now U.S. Pat. No. 9,153,663 issued Oct. 6, 2015, the entireties of which are incorporated herein by reference to the extent permitted by law. The present application claims the benefit of priority to Japanese Patent Application No. JP 2009-140930 filed on Jun. 12, 2009 in the Japan Patent Office, the entirety of which is incorporated by reference herein to the extent permitted by law.

BACKGROUND OF THE INVENTION

1. Field of the Invention

The present invention relates to semiconductor devices and manufacturing methods thereof.

2. Description of the Related Art

In current semiconductor integrated circuits, the characteristics of the transistors forming the circuit are improved by increasing carrier mobility through application of stress to the channel region using stressing film material (see, for example, JP-A-2005-57301, and JP-T-2008-539591). A simulation technique to calculate the electron state of the carriers taking into account strains caused by the applied stress to the channel also has been realized (see, for example, JP-A-2008-527745).

As described in these publications, the techniques of the related art propose the method of improving transistor characteristics using stressing film material, and the method of grasping the electron state of the carriers using stress. However, MOSFETs have not been realized that optimize the positional relationship between the applied stress to the channel region and the electron state in the vicinity of the source region. As such, attempts to improve characteristics using the applied stress to the channel region have not been effective.

A technique of related art using a process generally known as a gate first process in which the gate electrode is formed before the source region and drain region is described below with reference to, for example, the schematic cross sectional view, the carrier concentration distribution diagram, the potential distribution diagram, and the stress distribution diagram of FIG. 13.

As illustrated in (1) in FIG. 13, a gate electrode 114 is formed on a semiconductor substrate 111 via a gate insulating film 113.

A first side-wall insulating film 115 is formed on side walls of the gate electrode 114. A source-side extension region 116 is formed in the semiconductor substrate 111 on one side of the gate electrode 114, and a drain-side extension region 117 is formed in the semiconductor substrate 111 on the other side. The source-side extension region 116 and the drain-side extension region 117 are formed so as to intrude into regions underneath the end portions of the gate electrode 114.

A second side-wall insulating film 118 is formed on the both sides of the gate electrode 114 via the first side-wall insulating film 115. A source region 119 is formed via the source-side extension region 116 on one side of the gate electrode 114, and a drain region 120 is formed via the drain-side extension region 117 on the other side of the gate electrode 114. The source region 119 and the drain region 120 are formed in such a manner that the source-side extension region 116 and the drain-side extension region 117 remain underneath the second side-wall insulating film 118.

A first stress-introducing layer 121 (121S, 121D) is formed in regions of the semiconductor substrate 111 where the source region 119 and the drain region 120 are formed. For example, the source region 119 and the drain region 120 are formed in the first stress-introducing layer 121S and the first stress-introducing layer 121D, respectively. The first stress-introducing layer 121 ends substantially below the end portion of the second side-wall insulating film 118.

A silicide layer 122 is formed on the gate electrode 114, the source region 119, and the drain region 120.

A second stress-introducing layer 123 is formed so as to cover the gate electrode 114, the source region 119, and the drain region 120. An interlayer insulating film 124 is formed on the second stress-introducing layer 123.

In a semiconductor device 101 of the foregoing configuration, a channel region 112 is formed in the semiconductor substrate 111 between the source region 119 and the drain region 120.

In the semiconductor device 101 of the foregoing configuration, as represented in (2) in FIG. 13, the peaks of the carrier concentration distributions in the source-side extension region 116 and the drain-side extension region 117 occur inward of the end portions of the gate electrode 114 with respect to the gate length direction, in order to improve short channel characteristics.

Accordingly, as represented in (3) in FIG. 13, the peak of the potential distribution that occurs in the vicinity of the source-side extension region 116 is positioned more inward. Note that (3) in FIG. 13 represents a potential distribution of a conduction band under application of a positive potential to the drain with respect to the source in an nFET.

On the other hand, as represented in (4) in FIG. 13, the peaks in the distribution of the applied stress to the channel region 112 from the first stress-introducing layer 121 and the second stress-introducing layer 123 occur at the end portions of the second side-wall insulating film 118 on the side of the source region 119 and the drain region 120. In this manner, the stress introducing films create a discontinuous stress distribution in the channel region (see, for example, D. Kosemura et al., *Characterization of Strain for High Performance MOSFETs*, SSDM, pp. 390, 2007). Accordingly, the stress distribution of applied stress to the channel region 112 has a peak outward of the impurity boundary between the channel region 112 and the source-side extension region 116 (toward the source region 119).

SUMMARY OF THE INVENTION

The present inventors have recognized that the carrier velocity becomes slow when the peak of the stress distribution of the applied stress to the channel region is positioned outward of the impurity boundary between the channel region and the source-side extension region (toward the source region).

The present invention realizes improvements in carrier velocity and thus in saturation current characteristics through optimization of the peak position in the stress distribution of the applied stress to the channel region, and the peak position in the potential distribution that occurs in the vicinity of the source region.

According to an embodiment of the present invention, there is provided a semiconductor device that includes: a channel region formed in a semiconductor substrate; a source region formed on one side of the channel region; a drain region formed on the other side of the channel region; a gate electrode formed on the channel region via a gate insulating film; and a stress-introducing layer that applies stress to the channel region. The semiconductor device has a stress distribution in which source region-side and drain region-side peaks are positioned between a pn junction boundary of the channel region and the source region and a pn junction boundary of the channel region and the drain region.

In the semiconductor device of the embodiment of the present invention, a source region-side peak and a drain region-side peak of the stress distribution are positioned inward of the end portions of the gate electrode with respect to the gate length direction between the pn junction boundary of the channel region and the source region and the pn junction boundary of the channel region and the drain region. In this way, the peak of the stress distribution of the applied stress to the channel region overlaps with the peak of the potential distribution in the vicinity of the source region, making it possible to increase carrier velocity and thus improve saturation current characteristics.

For example, it has been found through simulation that the filling rate of carriers to the top sub-band of a conduction band increases as the compression stress applied to a p-type semiconductor is increased, as disclosed in, for example, S. E. Thompson, et al., *Uniaxial-Process-Induced Strained-Si: Extending the CMOS Roadmap*, IEEE Trans. Electron. Device, Vol. 53, pp. 1010 (2006).

Thus, the amount of carrier injected into the channel region can be increased by having an overlap between the peak position of the stress distribution and the peak position of the potential distribution in the vicinity of the source region.

According to another embodiment of the present invention, there is provided a method for manufacturing a semiconductor device, the method including the steps of: forming a first stress-introducing layer in a semiconductor substrate on both sides of a dummy gate pattern formed in advance on the semiconductor substrate; forming a side-wall insulating film on side walls of the dummy gate pattern; forming a source region in at least a portion of the first stress-introducing layer on one side of the dummy gate pattern via a source-side extension region, and forming a drain region in at least a portion of the first stress-introducing layer on the other side of the dummy gate pattern via a drain-side extension region; forming a second stress-introducing layer over a region from the side-wall insulating film on the side of the source region to the source region, and over a region from the side-wall insulating film on the side of the drain region to the drain region; and forming a gate electrode via a gate insulating film in a depression formed by removing the dummy gate pattern. The method adjusts impurity concentrations in the source-side extension region and the drain-side extension region according to a value of stress applied from the first stress-introducing layer and the second stress-introducing layer to a channel region formed in the semiconductor substrate between the source region and the drain region, so that a source region-side peak and a drain region-side peak of a stress distribution are positioned between an impurity boundary of the channel region and the source region and an impurity boundary of the channel region and the drain region.

According to still another embodiment of the present invention, there is provided a method for manufacturing a semiconductor device, the method including the steps of: forming a gate electrode on a semiconductor substrate via a gate insulating film; forming a first stress-introducing layer in the semiconductor substrate on both sides of the gate electrode; forming a side-wall insulating film on side walls of the gate electrode; forming a source region and a drain region on the both sides of the gate electrode via the side-wall insulating film, the source region being formed in at least a portion of the first stress-introducing layer via a source-side extension region on one side of the gate electrode, and the drain region being formed in at least a portion of the first stress-introducing layer via a drain-side extension region on the other side of the gate electrode; and forming a second stress-introducing layer over a region from the side-wall insulating film on the side of the source region to the source region, and over a region from the side-wall insulating film on the side of the drain region to the drain region. The method adjusts impurity concentrations in the source-side extension region and the drain-side extension region according to a value of stress applied from the first stress-introducing layer and the second stress-introducing layer to a channel region formed in the semiconductor substrate between the source region and the drain region, so that a source region-side peak and a drain region-side peak of a stress distribution are positioned between an impurity boundary of the channel region and the source region and an impurity boundary of the channel region and the drain region.

In the semiconductor device and the manufacturing method of certain embodiments of the present invention, the source region-side peak and the drain region-side peak of the stress distribution are positioned at the impurity boundary of the channel region and the source region, and at the impurity boundary of the channel region and the drain region, respectively. In this way, the peak of the stress distribution of the applied stress to the channel region overlaps with the peak of the potential distribution in the vicinity of the source region, making it possible to increase carrier velocity and thus improve saturation current characteristics.

With the semiconductor device according to the embodiment of the present invention, the amount of carrier injected into the channel region can be increased to increase carrier velocity and thus improve the driving capability of the transistor. Thus, the effect of improving characteristics by the applied stress to the channel region can be maximized. Further, the same effect can be advantageously expected for both n-channel and p-channel type semiconductor devices.

With a semiconductor device manufacturing method according to the embodiment of the present invention, the amount of carrier injected into the channel region can be increased to increase carrier velocity and thus improve the driving capability of the transistor. Thus, the effect of improving characteristics by the applied stress to the channel region can be maximized. Further, the same effect can be advantageously expected for both n-channel and p-channel type semiconductor devices.

BRIEF DESCRIPTION OF THE DRAWINGS

FIG. 4 is a manufacturing step cross sectional view illustrating a first exemplary manufacturing method of a semiconductor device according to Second Embodiment of the present invention.

FIG. 6 is a manufacturing step cross sectional view illustrating a first exemplary manufacturing method of a semiconductor device according to Second Embodiment of the present invention.

FIG. 7 is a manufacturing step cross sectional view illustrating a second exemplary manufacturing method of a semiconductor device according to Second Embodiment of the present invention.

FIG. 9 is a manufacturing step cross sectional view illustrating a third exemplary manufacturing method of a semiconductor device according to Second Embodiment of the present invention.

FIG. 12 is a view representing the simulation results of a stress distribution to demonstrate the effects of semiconductor devices of the second and third examples.

DESCRIPTION OF THE PREFERRED EMBODIMENTS

Embodiments of the present invention are described below.

1. First Embodiment

First Exemplary Configuration of Semiconductor Device
A first exemplary configuration of a semiconductor device according to First Embodiment of the present invention is described below with reference to FIG. 1.

Figure 1:
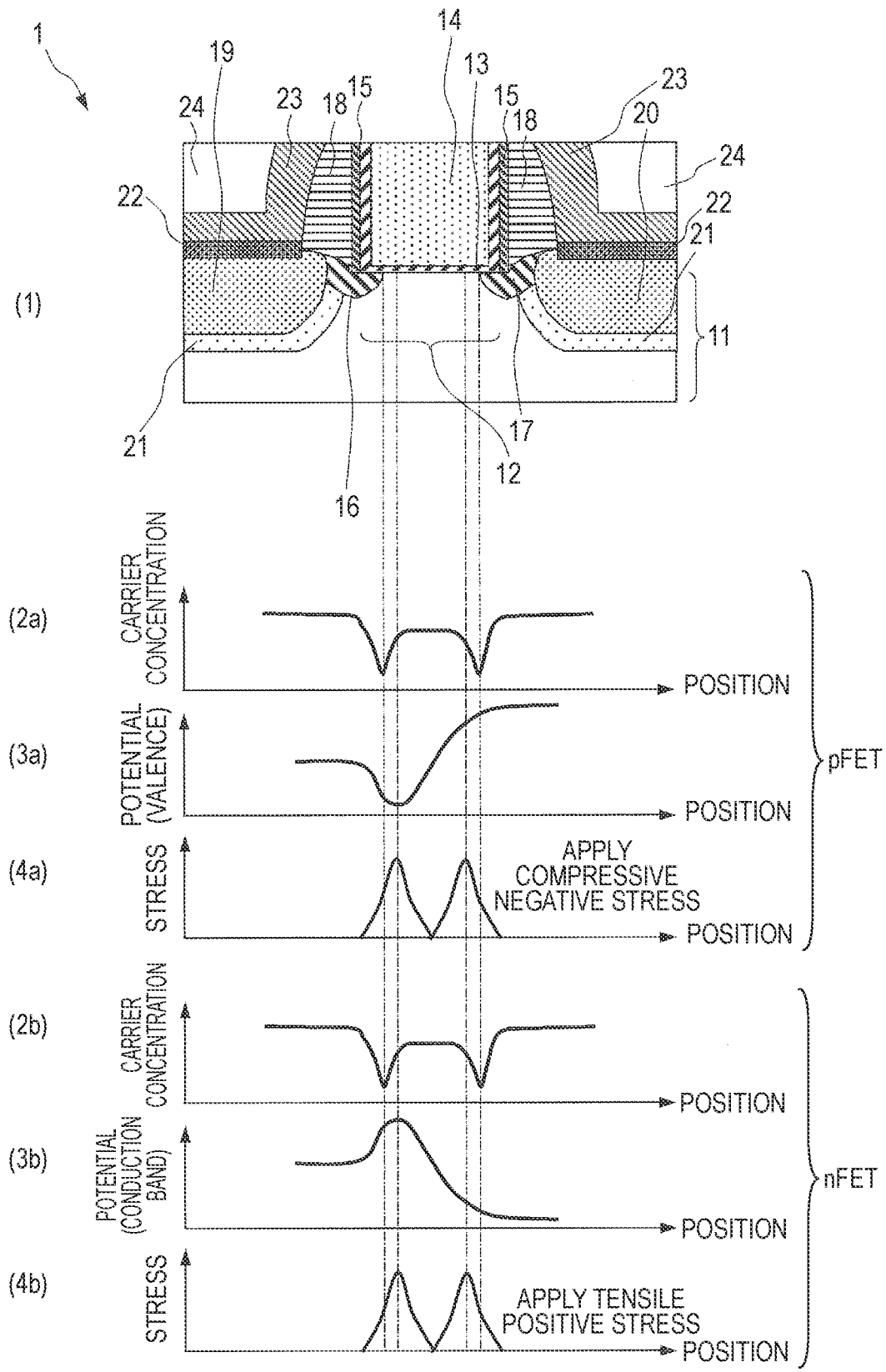
FIG. 1 is a diagram illustrating a first example of a semiconductor device according to First Embodiment of the present invention.

FIG. 1 represents (1) a schematic cross sectional view, (2) a carrier concentration distribution, (3) a potential distribution, and (4) a stress distribution in a channel region.

As illustrated in (1) in FIG. 1, a channel region 12 is formed in a region of a semiconductor substrate 11, and a gate electrode 14 is formed on the channel region 12 via a gate insulating film 13. A silicon substrate is used for the semiconductor substrate 11, for example.

The gate insulating film 13 is formed of a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Silicon oxide ($SiO_2$) or silicon oxynitride (SiON) also can be used. The thickness of the gate insulating film 13 is about 1 nm to about 3 nm. In this example, hafnium oxide ($HfO_2$) is used, for example.

The gate electrode 14 may be formed of polycrystalline silicon, or a metal layer or a metal compound layer.

Examples of a metal layer and a metal compound layer include titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru), and indium (Ir). In this example, a titanium nitride (TiN) film is used, for example.

Further, in this example, the gate insulating film 13 and the gate electrode 14 are monolayer films; however, each of these films may be a laminated layer of different materials to adjust threshold voltage or resistance value.

A first side-wall insulating film 15 is formed on side walls of the gate electrode 14. A second side-wall insulating film 18 is formed on the both sides of the gate electrode 14 via the first side-wall insulating film 15. For example, the first side-wall insulating film 15 and the second side-wall insulating film 18 may be monolayers or laminated layers of, for example, a silicon oxide ($SiO_2$) film or a silicon nitride film, and are formed in thicknesses of about 2 nm to about 10 nm and about 20 nm to about 100 nm, respectively. To reduce gate capacitance, a low-dielectric film (Low-k) used for films such as a wiring insulating film may also be used.

Note that the gate insulating film 13 and the gate electrode 14 are formed in the depression formed in the first side-wall insulating film 15 and the second side-wall insulating film 18 (described later in conjunction with a manufacturing method).

A source-side extension region 16 is formed in the semiconductor substrate 11 on one side of the gate electrode 14, and a drain-side extension region 17 is formed in the semiconductor substrate 11 on the other side. The source-side extension region 16 and the drain-side extension region 17 are formed so as to intrude into regions underneath the end portions of the gate electrode 14 with respect to the gate length direction. That is, the source-side extension region 16 and the drain-side extension region 17 are formed on the both sides of the channel region 12.

A first stress-introducing layer 21 is formed in the semiconductor substrate 11 on the both sides of the gate electrode 14. Thus, the source-side extension region 16 and the drain-side extension region 17 are formed to partially reside on the first stress-introducing layer 21 formed underneath the second side-wall insulating film 18.

A source region 19 is formed on one side of the gate electrode 14 via the source-side extension region 16, and a drain region 20 is formed on the other side of the gate electrode 14 via the drain-side extension region 17.

That is, the source region 19 and the drain region 20 are formed in such a manner that the source-side extension region 16 and the drain-side extension region 17 remain underneath the second side-wall insulating film 18.

The source region 19 and the drain region 20 are formed in the first stress-introducing layer 21.

The first stress-introducing layer 21 is formed of elements such as carbon (C) and germanium (Ge), and a silicon compound of these in a thickness of, for example, about 30 nm to about 100 nm. The carbon (C) or germanium (Ge) content is adjusted according to the stress to be applied to the channel region 12.

For example, SiGe is used for PMOS transistors to produce compression stress in the channel region. SiC is used for nMOS transistors to produce tensile stress in the channel region.

In the case of an n-type transistor, p-type impurities and n-type impurities are introduced into the channel region 12 and the source- and drain-side extension regions 16 and 17, respectively. In the case of a p-type transistor, n-type impurities and p-type impurities are introduced, respectively. Examples of n-type impurities include phosphorus (P) and arsenic (As). Examples of p-type impurities include boron (B), boron fluoride ($BF_2$), and indium (In). The impurities introduced to the source region 19 and the drain region 20 are of the same type as those for the source-side extension region 16 and the drain-side extension region 17.

A silicide layer 22 is formed on the source region 19 and the drain region 20. The silicide layer 22 is formed of, for example, titanium (Ti), cobalt (Co), nickel (Ni), platinum (Pt), or a compound of these, and is formed in a thickness of about 20 nm to about 70 nm.

A second stress-introducing layer 23 is formed so as to cover the second side-wall insulating film 18 and the silicide layer 22.

The second stress-introducing layer 23 is formed of a film having a tensile stress or a compression stress of about 1.5 GPa to about 2.2 GPa. For example, a silicon nitride film having a thickness of about 30 nm to about 70 nm is formed.

An interlayer insulating film 24 is formed so as to cover a part of or all of the second stress-introducing layer 23. The interlayer insulating film 24 is formed of, for example, TEOS or NSG. To enhance stress, the interlayer insulating film 24 may be formed of the same material used for the second stress-introducing layer 23.

Though not illustrated, the gate electrode 14 and the silicide layer 22 are connected to a wiring layer so that potential can be supplied thereto through the wiring layer.

A semiconductor device 1 is configured in this manner.

The following describes carrier concentration distribution, potential distribution, and stress distribution. FIGS. 1 (2a) to 1 (4a) represent the respective waveforms in the case of a pFET. FIGS. 1 (2b) to 1 (4b) represent the respective waveforms in the case of an nFET.

As represented in FIGS. 1 (2a) and 1(2b), the source-side extension region 16 and the drain-side extension region 17 of the semiconductor device 1 are formed in such a manner that, in both the pFET and the nFET, the peak positions of the carrier concentration occur inward of the end portions of the gate electrode 14 in the channel region 12.

As represented in (2) to (4) in FIG. 1, the stress distribution of the stress applied to the channel region 12 from the first stress-introducing layer 21 and the second stress-introducing layer 23 has peaks inward of the peak of the carrier concentration distribution in the vicinity of the source-side extension region 16. FIG. 1(3b) represents a potential distribution of a conduction band under application of a positive potential to the drain with respect to the source in the n-type FET. FIG. 1(4b) represents a positive stress (tensile stress) distribution in the n-type FET. FIG. 1(3a) represents a potential distribution of a valence under application of a negative potential to the drain with respect to the source in the p-type FET. FIG. 1(4a) represents a negative stress (compression stress) distribution in the p-type FET.

In other words, the peaks of the stress distribution on the side of the source region 19 and the drain region 20 are positioned between the peak of the carrier concentration distribution on the source region 19 side and the peak of the carrier concentration distribution on the drain region 20 side in the channel region 12.

The peak of the potential in the vicinity of the source-side extension region 16 overlaps with the peak of the stress distribution of the stress applied to the channel region 12.

Regarding the carrier concentrations of the source-side extension region 16 and the drain-side extension region 17 and the applied stress to the channel region 12 in the first exemplary configuration, it has been possible to measure these parameters by the physical analysis of a device cross section. For example, the carrier concentration can be measured using scanning spread resistance microscopy (SSRM) or a scanning capacitance microscope (SCM). Measurement of the stress can be made by methods such as UV-Raman spectroscopy (see, for example, D. Kosemura et al., *Characterization of Strain for High Performance MOSFETs*, SSDM, pp. 390, 2007) and nano-beam diffraction (NBD). With these methods, the peak of the potential distribution in the vicinity of the source-side extension region 16 can be matched in position with the peak of the stress distribution applied to the channel region 12.

As noted above, it is important that the peak of the potential distribution in the vicinity of the source-side extension region 16 overlaps with the peak of the stress distribution applied to the channel region 12.

In a structure in which the source-side extension region 16 and the drain-side extension region 17 are asymmetrical, a shift may occur in the peak position of the carrier concentration distribution of the drain-side extension region 17.

In the semiconductor device 1, the peak positions of the stress distribution on the source region 19 side and the drain region 20 side occur between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase the amount of carrier injected into the channel region 12.

The increased carrier amount injected into the channel region 12 increases the carrier velocity, and thus improves the driving capability of the transistor. Thus, the effect of improving characteristics by the applied stress to the channel region 12 can be maximized. The same effect can be expected for both the n-type FET and the p-type FET.

Second Exemplary Configuration of Semiconductor Device

A second exemplary configuration of a semiconductor device according to First Embodiment of the present invention is described below with reference to FIG. 2.

Figure 2:
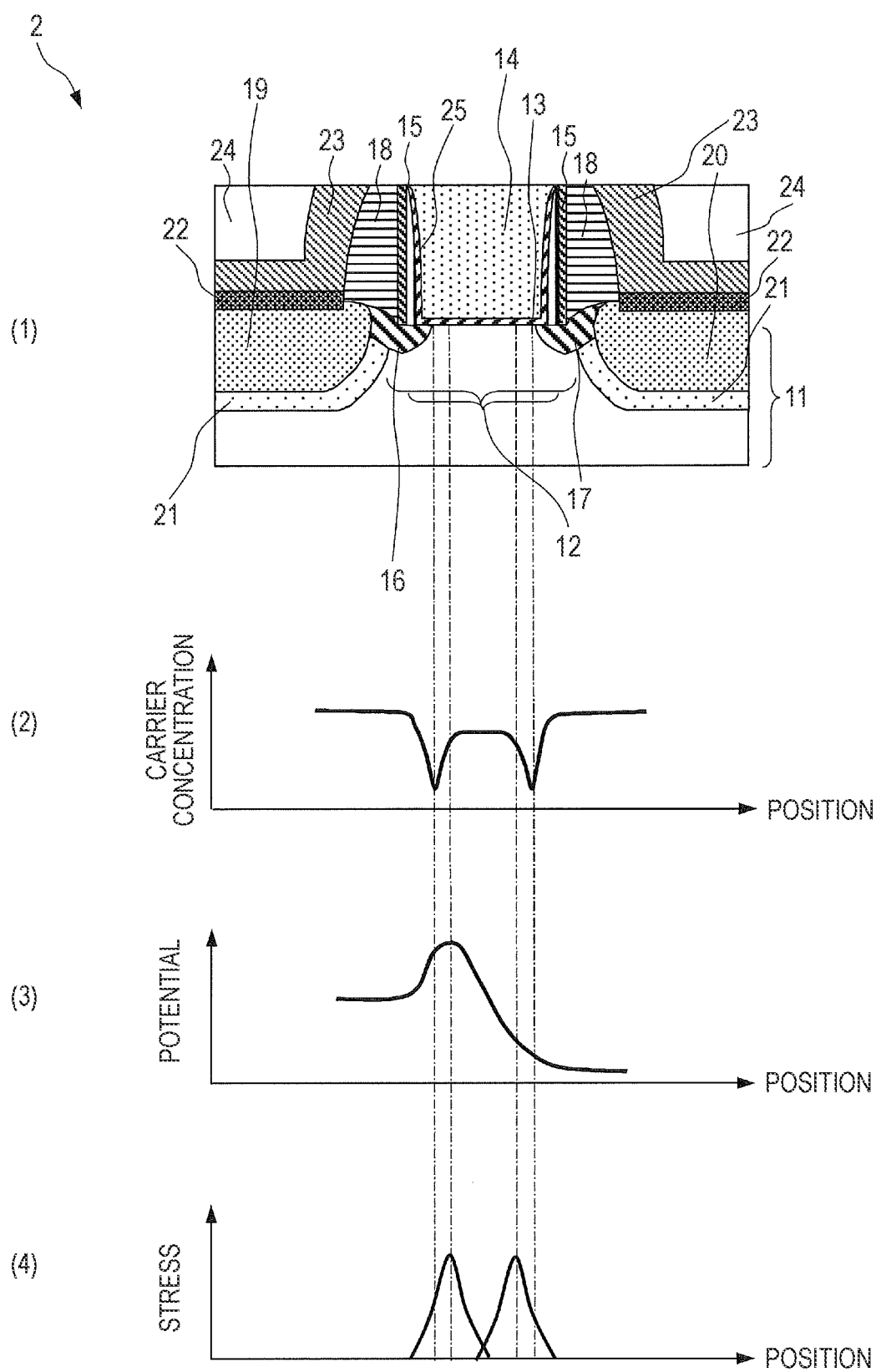
FIG. 2 is a diagram illustrating a second example of a semiconductor device according to First Embodiment of the present invention.

FIG. 2 represents (1) a schematic cross sectional view, (2) a carrier concentration distribution, (3) a potential distribution, and (4) a stress distribution in a channel region. As an example, (2) to (4) in FIG. 2 represent waveforms in the case of an nFET.

As illustrated in FIG. 2, a channel region 12 is formed in a region of a semiconductor substrate 11, and a gate electrode 14 is formed on the channel region 12 via a gate insulating film 13. A silicon substrate is used for the semiconductor substrate 11, for example.

The gate insulating film 13 is formed of a high dielectric (High-k) film such as hafnium oxide (HfO$_2$), hafnium aluminum oxide (HfAlO$_2$), hafnium silicon oxide (HfSiO), tantalum oxide (Ta$_2$O$_5$), aluminum oxide (Al$_2$O$_3$), and zirconium oxide (ZrO$_2$) Silicon oxide (SiO$_2$) or silicon oxynitride (SiON) also can be used. The thickness of the gate insulating film 13 is about 1 nm to about 3 nm. In this example, hafnium oxide (HfO$_2$) is used, for example.

The gate electrode 14 may be formed of polycrystalline silicon, or a metal layer or a metal compound layer.

Examples of a metal layer and a metal compound layer include titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru), and indium (Ir). In this example, a titanium nitride (TiN) film is used, for example.

Further, in this example, the gate insulating film 13 and the gate electrode 14 are monolayer films; however, each of these films may be a laminated layer of different materials to adjust threshold voltage or resistance value.

A first side-wall insulating film 15 is formed on side walls of the gate electrode 14. A second side-wall insulating film 18 is formed on the both sides of the gate electrode 14 via the first side-wall insulating film 15. Further, a third side-wall insulating film 25 is formed on the inner side of the second side-wall insulating film 18.

For example, the first side-wall insulating film 15, the second side-wall insulating film 18, and the third side-wall insulating film 25 may be monolayers or laminated layers of, for example, a silicon oxide (SiO$_2$) film or a silicon nitride film. The first side-wall insulating film 15 is formed in a thickness of about 2 nm to about 10 nm. The second side-wall insulating film 18 is formed in a thickness of about 20 nm to about 100 nm. The third side-wall insulating film 25 is formed in a thickness of about 2 nm to about 6 nm. To reduce gate capacitance, a low-dielectric film (Low-k) used for films such as a wiring insulating film may also be used for these side-wall insulating films.

Note that the gate insulating film 13 and the gate electrode 14 are formed in the depression formed in the second side-wall insulating film 18 (described later in conjunction with a manufacturing method).

A source-side extension region 16 is formed in the semiconductor substrate 11 on one side of the gate electrode 14, and a drain-side extension region 17 is formed in the semiconductor substrate 11 on the other side. The source-side extension region 16 and the drain-side extension region 17 are formed so as to intrude into regions underneath the end portions of the gate electrode 14 with respect to the gate length direction. That is, the source-side extension region 16 and the drain-side extension region 17 are formed on the both sides of the channel region 12.

A first stress-introducing layer 21 is formed in the semiconductor substrate 11 on the both sides of the gate electrode 14. Thus, the source-side extension region 16 and the drain-side extension region 17 are formed to partially reside on the first stress-introducing layer 21 formed underneath the second side-wall insulating film 18.

A source region 19 is formed on one side of the gate electrode 14 via the source-side extension region 16, and a drain region 20 is formed on the other side of the gate electrode 14 via the drain-side extension region 17.

That is, the source region 19 and the drain region 20 are formed in such a manner that the source-side extension region 16 and the drain-side extension region 17 remain underneath the second side-wall insulating film 18.

The source region 19 and the drain region 20 are formed in the first stress-introducing layer 21.

The first stress-introducing layer 21 is formed of elements such as carbon (C) and germanium (Ge), and a silicon compound of these in a thickness of, for example, about 30 nm to about 100 nm. The carbon (C) or germanium (Ge) content is adjusted according to the stress to be applied to the channel region 12.

For example, SiGe is used for PMOS transistors, and SiC is used for nMOS transistors.

In the case of an n-type transistor, p-type impurities and n-type impurities are introduced into the channel region 12 and the source- and drain-side extension regions 16 and 17, respectively. In the case of a p-type transistor, n-type impurities and p-type impurities are introduced, respectively. Examples of n-type impurities include phosphorus (P) and arsenic (As). Examples of p-type impurities include boron (B), boron fluoride (BF$_2$), and indium (In). The impurities introduced to the source region 19 and the drain region 20 are of the same type as those for the source-side extension region 16 and the drain-side extension region 17.

A silicide layer 22 is formed on the source region 19 and the drain region 20. The silicide layer 22 is formed of, for example, titanium (Ti), cobalt (Co), nickel (Ni), platinum (Pt), or a compound of these, and is formed in a thickness of about 20 nm to about 70 nm.

A second stress-introducing layer 23 is formed so as to cover the second side-wall insulating film 18 and the silicide layer 22.

The second stress-introducing layer 23 is formed of a film having a tensile stress or a compression stress of about 1.5 GPa to about 2.2 GPa. For example, a silicon nitride film having a thickness of about 30 nm to about 70 nm is formed.

An interlayer insulating film 24 is formed so as to cover a part of or all of the second stress-introducing layer 23. The interlayer insulating film 24 is formed of, for example, TEOS or NSG. To enhance stress, the interlayer insulating film 24 may be formed of the same material used for the second stress-introducing layer 23.

Though not illustrated, the gate electrode 14 and the silicide layer 22 are connected to a wiring layer so that potential can be supplied thereto through the wiring layer.

A semiconductor device 2 is configured in this manner.

As represented in (2) in FIG. 2, the source-side extension region 16 and the drain-side extension region 17 of the semiconductor device 2 are formed in such a manner that the carrier concentration occurs inward of the end portions of the gate electrode 14 in the channel region 12.

Further, as represented in (2) to (4) in FIG. 2, the peak of the carrier concentration distribution in the vicinity of the source-side extension region 16 occurs at an end portion of the gate electrode 14. The stress distribution of the stress applied in the channel region 12 from the first stress-introducing layer 21 and the second stress-introducing layer 23 has peaks inward of the peak of the carrier concentration distribution in the vicinity of the source-side extension region 16. Thus, in this structure, the peak of the stress distribution of the stress applied to the channel region 12 overlaps with the peak of the potential distribution in the vicinity of the source-side extension region 16, on the inner side of the end portions of the gate electrode 14.

This enables the overlap capacitance between the gate electrode 14 and the source- and drain-side extension regions 16 and 17 to be reduced more than in the semiconductor device 1 of the first example.

In the semiconductor device 2, the peak positions of the stress distribution on the source region 19 side and the drain region 20 side occur between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase carrier velocity and thus improve saturation current characteristics.

The increased carrier amount injected into the channel region 12 increases the carrier velocity, and thus improves the driving capability of the transistor. Thus, the effect of improving characteristics by the applied stress to the channel region 12 can be maximized. The same effect can be advantageously expected also for an n-channel type semiconductor device.

Third Exemplary Configuration of Semiconductor Device

A third exemplary configuration of a semiconductor device according to First Embodiment of the present invention is described below with reference to FIG. 3.

Figure 3:
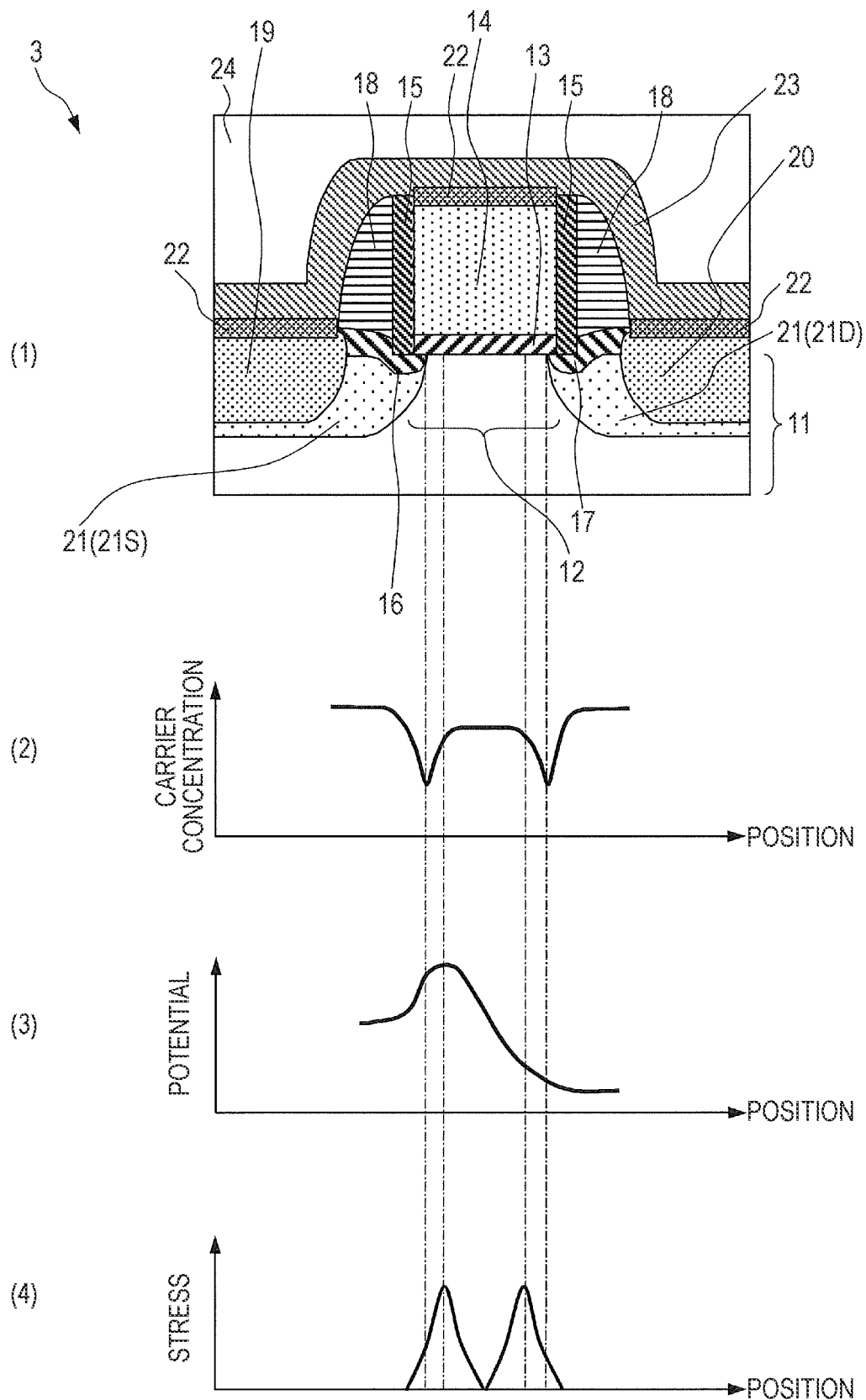
FIG. 3 is a diagram illustrating a third example of a semiconductor device according to First Embodiment of the present invention.

FIG. 3 represents (1) a schematic cross sectional view, (2) a carrier concentration distribution, (3) a potential distribution, and (4) a stress distribution in a channel region. As an example, (2) to (4) in FIG. 3 represent waveforms in the case of an nFET.

As illustrated in FIG. 3, a channel region 12 is formed in a region of a semiconductor substrate 11, and a gate electrode 14 is formed on the channel region 12 via a gate insulating film 13. A silicon substrate is used for the semiconductor substrate 11, for example.

The gate insulating film 13 is formed of a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Silicon oxide ($SiO_2$) or silicon oxynitride (SiON) also can be used. The thickness of the gate insulating film 13 is about 1 nm to about 3 nm. In this example, hafnium oxide ($HfO_2$) is used, for example.

The gate electrode 14 may be formed of polycrystalline silicon, or a metal layer or a metal compound layer.

Examples of a metal layer and a metal compound layer include titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru), and indium (Ir). In this example, a titanium nitride (TiN) film is used, for example.

Further, in this example, the gate insulating film 13 and the gate electrode 14 are monolayer films; however, each of these films may be a laminated layer of different materials to adjust threshold voltage or resistance value.

A first side-wall insulating film 15 is formed on side walls of the gate electrode 14. A second side-wall insulating film 18 is formed on the both sides of the gate electrode 14 via the first side-wall insulating film 15. For example, the first side-wall insulating film 15 and the second side-wall insulating film 18 may be monolayers or laminated layers of, for example, a silicon oxide ($SiO_2$) film or a silicon nitride film, and are formed in thicknesses of about 20 nm to about 50 nm and about 20 nm to about 100 nm, respectively. To reduce gate capacitance, a low-dielectric film (Low-k) used for films such as a wiring insulating film may also be used.

A source-side extension region 16 is formed in the semiconductor substrate 11 on one side of the gate electrode 14, and a drain-side extension region 17 is formed in the semiconductor substrate 11 on the other side. The source-side extension region 16 and the drain-side extension region 17 are formed so as to intrude into regions underneath the end portions of the gate electrode 14.

A source region 19 is formed on one side of the gate electrode 14 via the source-side extension region 16, and a drain region 20 is formed on the other side of the gate electrode 14 via the drain-side extension region 17. The source region 19 and the drain region 20 are formed in such a manner that the source-side extension region 16 and the drain-side extension region 17 remain underneath the second side-wall insulating film 18.

A first stress-introducing layer 21 (21S, 21D) is formed in regions of the semiconductor substrate 11 where the source region 19 and the drain region 12 are formed.

For example, the source region 19 and the drain region 20 are formed in the first stress-introducing layer 21S and the first stress-introducing layer 21D, respectively. The first stress-introducing layer 21 ends substantially underneath the end portion of the gate electrode 14. Thus, the source-side extension region 16 and the drain-side extension region 17 underneath the second side-wall insulating film 18 are formed in the first stress-introducing layer 21.

In the case of an n-type transistor, p-type impurities and n-type impurities are introduced into the channel region 12 and the source- and drain-side extension regions 16 and 17, respectively. In the case of a p-type transistor, n-type impurities and p-type impurities are introduced, respectively. Examples of n-type impurities include phosphorus (P) and arsenic (As). Examples of p-type impurities include boron (B), boron fluoride ($BF_2$), and indium (In). The impurities introduced to the source region 19 and the drain region 20 are of the same type as those for the source-side extension region 16 and the drain-side extension region 17.

The first stress-introducing layer 21 is formed of elements such as carbon (C) and germanium (Ge), and a silicon compound of these in a thickness of, for example, about 30 nm to about 100 nm. The carbon (C) or germanium (Ge) content is adjusted according to the stress to be applied to the channel region 12.

For example, SiGe is used for PMOS transistors, and SiC is used for nMOS transistors.

A silicide layer 22 (22S, 22D) is formed on the source region 19 and the drain region 20. When a polycrystalline silicon layer is used for the gate electrode 14, a silicide layer 22 (22G) may be formed on the gate electrode 14. The silicide layer 22 is formed of, for example, titanium (Ti), cobalt (Co), nickel (Ni), platinum (Pt), or a compound of these, and is formed in a thickness of about 20 nm to about 70 nm.

A second stress-introducing layer 23 is formed so as to cover the gate electrode 14, the source region 19, and the drain region 20. Specifically, the second stress-introducing layer 23 has a continuous structure covering the silicide layer 22 on the source region 19, the second side-wall insulating film 18 and the gate electrode 14, and the silicide layer 22 on the drain region 20.

An interlayer insulating film 24 is formed on the second stress-introducing layer 23.

The second stress-introducing layer 23 is formed of a film having a tensile stress or a compression stress of about 1.5 GPa to about 2.2 GPa. For example, a silicon nitride film having a thickness of about 30 nm to about 70 nm is formed. The interlayer insulating film 24 is formed of, for example, TEOS or NSG. To enhance stress, the interlayer insulating film 24 may be formed of the same material used for the second stress-introducing layer 23.

In a semiconductor device 3 of the foregoing configuration, the channel region 12 is formed in the semiconductor substrate 11 between the source region 19 and the drain region 20.

Though not illustrated, the gate electrode 14 and the silicide layer 22 are connected to a wiring layer so that potential can be supplied thereto through the wiring layer.

The semiconductor device 3 is configured in this manner.

As represented in (2) to (4) in FIG. 3, the carrier concentration distribution in the vicinity of the source-side extension region 16 has a peak inward of the end portion of the gate electrode 14. The peak positions of the stress distribution of the stress applied to the channel region 12 occur inward of the peak of the carrier concentration distribution in the vicinity of the source-side extension region 16. That is, in this structure, the peak of the stress distribution of the stress applied to the channel region 12 overlaps with the peak of the potential distribution in the vicinity of the source-side extension region 16, on the inner side of the end portions of the gate electrode 14.

In the semiconductor device 3, the peak positions of the stress distribution on the source region 19 side and the drain region 20 side occur between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase carrier velocity and thus improve saturation current characteristics.

The increased carrier amount injected into the channel region 12 increases the carrier velocity, and thus improves the driving capability of the transistor. Thus, the effect of improving characteristics by the applied stress to the channel region 12 can be maximized. The same effect can be advantageously expected also for an n-channel type semiconductor device.

Second Embodiment

First Exemplary Manufacturing Method of Semiconductor Device A first exemplary manufacturing method of a semiconductor device according to Second Embodiment of the present invention is described below with reference the manufacturing step cross sectional views of FIG. 4 to FIG. 6. The manufacturing method is an exemplary manufacturing method of the semiconductor device 1 of the foregoing first example.

As illustrated in (1) in FIG. 4, a dummy gate pattern 41 is formed on a semiconductor substrate 11. The dummy gate pattern 41 is formed by first forming a dummy insulating film 42 as a lower layer, and then laminating a dummy gate electrode film 43 and a hard mask film 44 in this order, followed by patterning.

Though not illustrated, prior to forming the dummy insulating film 42, a well region may be formed in the semiconductor substrate 11 by introducing impurities using an ion implantation method after forming an element isolation region in the semiconductor substrate 11. Here, the dummy insulating film 42 is formed of, for example, a silicon oxide ($SiO_2$) film. The silicon oxide film has a thickness of, for example, about 1 nm to about 3 nm. Methods, for example, such as a thermal oxidation method and a chemical vapor deposition method (CVD) can be used.

The dummy gate electrode film 43 is formed of, for example, a polycrystalline silicon film. The polycrystalline silicon film is formed in a thickness of, for example, about 80 nm to about 150 nm, using, for example, a CVD method.

In this example, a gate insulating film may be formed at this stage without forming the dummy insulating film 42, because the dummy insulating film 42 is removed in a later step to form the gate insulating film. In this case, the gate insulating film may be formed of, for example, a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Materials such as silicon oxide ($SiO_2$) and silicon oxynitride (SiON) also can be used. The gate insulating film is formed in a thickness of, for example, 1 nm to 3 nm.

The hard mask film 44 is formed of, for example, a silicon nitride film. The silicon nitride film is formed in a thickness of, for example, about 50 nm to about 150 nm. A CVD method is used as the deposition method.

Thereafter, a resist pattern (not shown) is formed using a photolithography technique or an electron lithography technique.

Then, the hard mask film 44 is etched to form a hard mask 45 by dry etching, using the resist pattern as an etching mask.

After removing the resist pattern, a dummy gate electrode 46 and a dummy gate insulating film 47 are formed by etching the dummy gate electrode film 43 and the dummy insulating film 42 using the hard mask 45 as an etching mask. Here, the dummy gate electrode film 43 and the dummy insulating film 42 may be etched without removing the resist pattern.

This completes the formation of the dummy gate pattern 41 including the dummy gate insulating film 47, the dummy gate electrode 46, and the hard mask 45 in this order from the bottom.

Next, as illustrated in (2) in FIG. 4, a dummy side-wall insulating film 48 is formed on side walls of the dummy gate pattern 41. The dummy side-wall insulating film 48 is formed by first forming an insulating film over the whole surface of the semiconductor substrate 11, and then etching back the insulating film using a method such as dry etching in a manner allowing the insulating film to remain on the side walls of the dummy pattern 41.

The dummy side-wall insulating film 48 is formed of, for example, a silicon nitride film, a $SiO_2$ film, TEOS (tetra ethyl ortho silicate) film, or an NSG film in a thickness of, for example, about 50 nm to about 150 nm. A CVD method is used as the deposition method, for example.

Then, the whole surface of the semiconductor substrate 11 is recess etched using a method such as dry etching. Here, the etch back is more selective for the hard mask 45 and the dummy side-wall insulating film 48 than for the semiconductor substrate 11 so that only the semiconductor substrate 11 can be etched.

When the element isolation region (not shown) is formed, it is preferable to increase the selectivity as high as possible against the material forming the element isolation region. Here, a trench 49 having a depth of about 50 nm to about 100 nm is formed in the semiconductor substrate 11.

A first stress-introducing layer 21 is then selectively formed in the trench 49. The first stress-introducing layer 21 is formed by a selective epitaxial growth method, using, for example, silicon germanium (SiGe) when introducing compression stress, and silicon carbide (SiC) when introducing tensile stress. The deposition thickness of epitaxial growth is, for example, about 50 nm to about 200 nm.

When forming a silicide electrode on the SiGe or SiC as in this example, it is preferable that a silicon layer (not shown) be laminated on the first stress-introducing layer 21 in a thickness of about 30 nm to about 50 nm.

When forming the first stress-introducing layer 21, impurities may be introduced at the same time to form source and drain regions. For example, in the case of an n-type transistor, n-type impurities are introduced. In the case of a p-type transistor, p-type impurities are introduced.

Next, as illustrated in (3) in FIG. 4, the dummy side-wall insulating film 48 (see (2) in FIG. 4) is removed by, for example, wet etching. Then, an insulating film is formed over the whole surface of the semiconductor substrate 11 so as to cover the dummy gate pattern 41. The insulating film is then etched back using a method such as dry etching to form a first side-wall insulating film 15 on the side walls of the dummy gate pattern 41. The first side-wall insulating film 15 is formed of, for example, silicon nitride, TEOS, NSG, or $SiO_2$ in a thickness of, for example, about 2 nm to about 10 nm. For example, a CVD method is used as the deposition method of the insulating film used to form the first side-wall insulating film 15.

Unlike the present example, there are cases where the first side-wall insulating film 15 is not formed.

Figure 5:
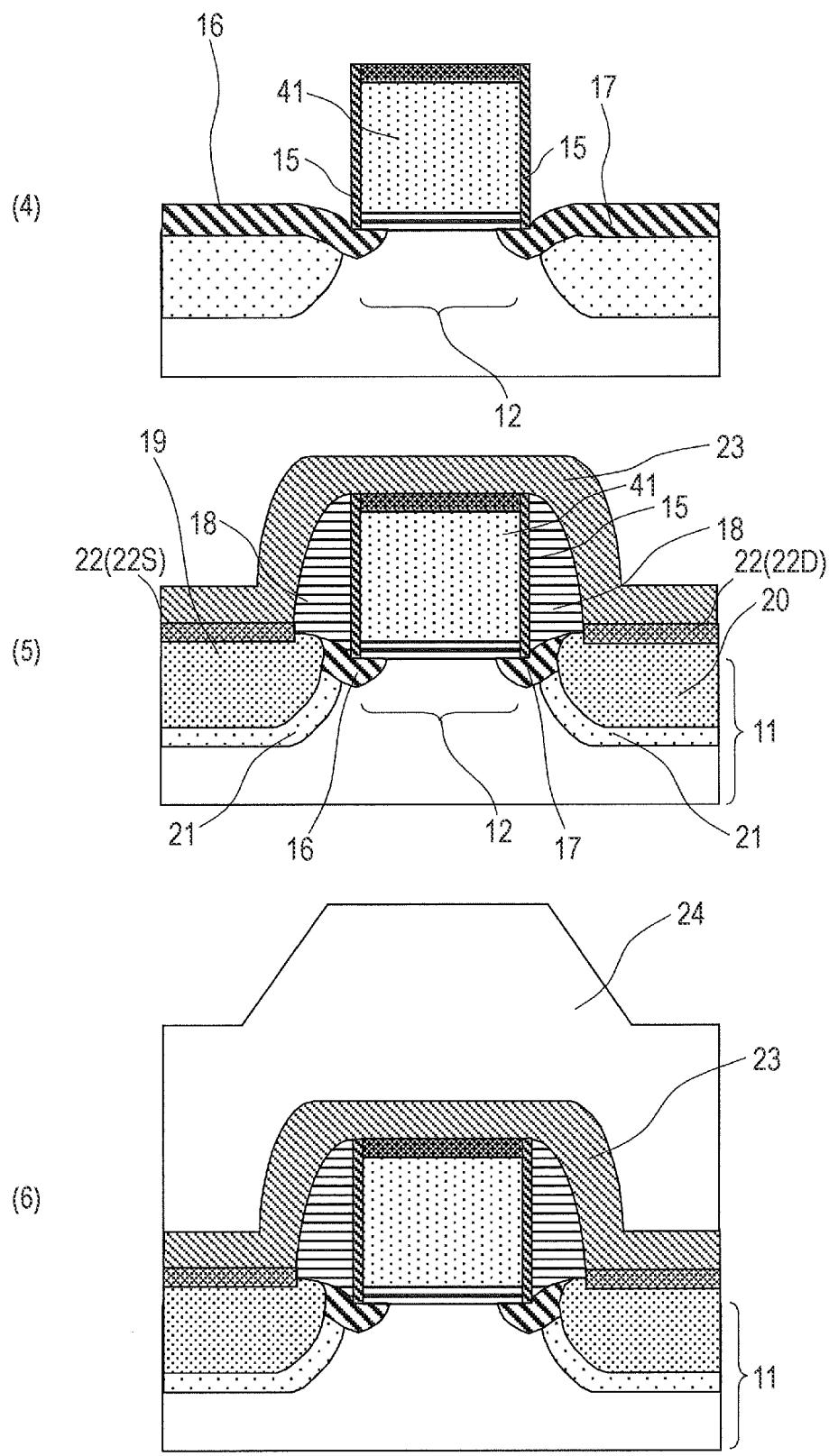
FIG. 5 is a manufacturing step cross sectional view illustrating a first exemplary manufacturing method of a semiconductor device according to Second Embodiment of the present invention.

Next, as illustrated in (4) in FIG. 5, ion implantation is performed using elements such as the dummy gate pattern 41, the first side-wall insulating film 15, and the element isolation region (not shown) as a mask so as to simultaneously form a source-side extension region 16 and a drain-side extension region 17 in the semiconductor substrate 11. In the case of an n-type transistor, n-type impurities are introduced to the source-side extension region 16 and the drain-side extension region 17. In the case of a p-type transistor, p-type impurities are introduced.

Prior to the transistor formation, the stress distribution of the applied stress to the channel region 12 is grasped, and impurities are introduced by ion implantation in such a manner that the peak of the stress distribution overlaps in position with the peak of the potential distribution that occurs in the vicinity of the source-side extension region 16. Here, the thickness of the first side-wall insulating film 15 may be adjusted.

For example, in this example, elements such as arsenic (As) are used as n-type impurities, and these impurities are implanted in a dose amount of about $7 \times 10^{14}$ $cm^{-2}$ to about $2 \times 10^{15}$ $cm^{-2}$ at an energy of 1 keV to 2 keV.

Elements such as boron fluoride ($BF_2$) are used as p-type impurities, and these impurities are implanted in a dose amount of about $8 \times 10^{14}$ $cm^{-2}$ to about $3 \times 10^{15}$ $cm^{-2}$ at an energy of 1 keV to 3 keV.

The impurities are implanted at, for example, a 0° implantation angle with respect to the semiconductor substrate 11 (perpendicular to the plane of the semiconductor substrate 11).

In some cases, impurities of the opposite conduction type from the impurities for the source-side extension region 16 and the drain-side extension region 17 are implanted more deep down past the source-side extension region 16 and the drain-side extension region 17. In this way, a steeper impurity profile can be obtained in the depth direction of the source-side extension region 16 and the drain-side extension region 17.

The ion implantation conditions to form the source-side extension region 16 and the drain-side extension region 17 need to be adjusted according to the distribution peak of the applied stress to the channel region 12, and are therefore not limited to the foregoing example. In this example, the ion implantation conditions are adjusted based on a combination of the first stress-introducing layer 21 and the second stress-introducing layer to be described later.

Next, as illustrated in (5) in FIG. 5, after forming an insulating film over the whole surface of the semiconductor substrate 11, a second side-wall insulating film 18 is formed on the side surfaces of the first side-wall insulating film 15 by etch back using dry etching.

The insulating film to be the second side-wall insulating film 18 is formed of, for example, a silicon nitride film, TEOS, NSG, or $SiO_2$ in a thickness of, for example, about 20 nm to about 100 nm. A CVD method is used as the deposition method, for example. The second side-wall insulating film 18, formed as a single-layer insulating film in this example, may be a laminate of multiple insulating films.

Then, a source region 19 and a drain region 20 are formed in the semiconductor substrate 11 (substantially in the first stress-introducing layer 21) by ion implantation using elements such as the hard mask 45, the first side-wall insulating film 15, and the second side-wall insulating film 18 as a mask. Specifically, the source region 19 is formed on one side of the dummy pattern 41 via the source-side extension region 16, and the drain region 20 is formed on the other side of the dummy pattern 41 via the drain-side extension region 17. The source region 19 and the drain region 20 are formed by implanting impurities of the same type as those used for the source-side extension region 16 and the drain-side extension region 17.

This is followed by annealing to activate the impurities implanted into the source-side extension region 16, the drain-side extension region 17, the source region 19, and the drain region 20. The activation causes the impurities to diffuse, and as a result the source-side extension region 16 and the drain-side extension region 17 spread over to regions underneath the end portions of the dummy gate electrode 46 in the gate length direction. The activation annealing is performed by, for example, rapid thermal processing (RTA) at a temperature of about 1,000° C. to about 1,100° C.

The activation determines the final positions of the source-side extension region 16 and the drain-side extension region 17. As such, the annealing conditions are adjusted according to the ion implantation conditions of forming the source-side extension region 16 and the drain-side extension region 17, and the applied stress to the channel region 12.

Specifically, adjustment is made so that the peak of the stress distribution of the applied stress to the channel region 12 occurs inward of the end portions of the subsequently formed gate electrode and overlaps with the peak of the potential distribution in the vicinity of the source-side extension region 16.

Then, a silicide layer 22 (22S, 22D) is formed on the source region 19 and the drain region 20 using a salicide process technique. The silicide layer 22 is formed by, for example, silicidation of titanium (Ti), cobalt (Co), nickel (Ni), platinum (Pt), or a compound thereof in a thickness of, for example, about 20 nm to about 70 nm.

Then, as illustrated in (6) in FIG. 5, a second stress-introducing layer 23 is formed over the whole surface of the semiconductor substrate 11 so as to cover elements such as the dummy gate pattern 41 and the silicide layer 22, followed by formation of an interlayer insulating film 24.

The second stress-introducing layer 23 is formed of a film having a tensile stress or a compression stress of about 1.5 GPa to about 2.2 GPa. For example, a silicon nitride film having a thickness of about 30 nm to about 70 nm is formed.

The interlayer insulating film 24 is formed of, for example, TEOS or NSG. To enhance stress, the interlayer insulating film 24 may be formed of the same material used for the second stress-introducing layer 23.

Then, as illustrated in (7) in FIG. 6, the interlayer insulating film 24, the second stress-introducing layer 23, and the hard mask 45 (see FIGS. 4 and 5, and elsewhere) are removed to expose the dummy gate electrode 46 on the top. The removal is performed by polishing the films by, for example, chemical mechanical polishing (CMP).

Next, as illustrated in (8) in FIG. 6, the dummy gate electrode 46 (see (7) in FIG. 6 and elsewhere) and the dummy gate insulating film 47 (see FIGS. 4 and 5, and elsewhere) are removed by etching to form a depression 50. The dummy gate electrode 46 is selectively removed by, for example, dry etching. The dummy gate insulating film 47 is selectively removed by, for example, dry etching or wet etching.

Thereafter, as illustrated in (9) in FIG. 6, a gate insulating film 13 is formed on the inner surfaces of the depression 50. Here, the gate insulating film 13 is also formed on elements including the interlayer insulating film 24, the second stress-introducing layer 23, the second side-wall insulating film 18, and the first side-wall insulating film 15. This is followed by formation of a gate electrode forming film 51, filling the depression 50. Here, the gate electrode forming film 51 is also formed on the gate insulating film 13 residing on elements including the interlayer insulating film 24 and the second stress-introducing layer 23.

The excess films, including the excess portions of the gate electrode forming film 51 and the gate insulating film 13 are then removed by chemical mechanical polishing (CMP) to form a gate electrode 14 in the depression 50 via the gate insulating film 13.

The gate insulating film 13 is formed of a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Silicon oxide ($SiO_2$) or silicon oxynitride (SiON) also can be used. The thickness is about 1 nm to about 3 nm. The deposition method may be, for example, atomic layer deposition (ALD) or chemical vapor deposition (CVD). When using silicon oxide, a thermal oxidation method may be used. Further, these may be laminated to form the film. In this example, hafnium oxide ($HfO_2$) is used.

The gate electrode 14 (gate electrode forming film 51) is formed of titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru) or indium (Ir). The deposition method may be, for example, ALD, physical vapor deposition (PVD), or chemical vapor deposition (CVD). In this example, a titanium nitride (TiN) film is deposited using PVD.

Further, the gate insulating film 13 and the gate electrode 14 formed as monolayer films in this example may be laminates of different material layers.

Chemical mechanical polishing (CMP) is used for the removal of the gate electrode 14 and the gate insulating film 13 formed on elements including the second stress-introducing layer 23 and the interlayer insulating film 24.

Though not illustrated, a wiring interlayer insulating film is subsequently formed on elements including the gate electrode 14, the second stress-introducing layer 23, and the interlayer insulating film 24. A wiring layer is then connected to the gate electrode 14 and the silicide layer 22 to enable a supply of potential through the wiring layer.

When the gate electrode 14 is formed of polycrystalline silicon, there are cases where a silicide layer is formed on the gate electrode 14.

After the manufacture, the peak of the stress distribution of the applied stress to the channel region 12 is positioned inward of the peak of the carrier concentration distribution in the source-side extension region 16, and, at a position about 15 nm inward from the end portion of the gate electrode 14 with respect to the gate length direction, overlaps with the peak of the potential distribution that occurs in the vicinity of the source-side extension region 16.

This completes the formation of the semiconductor device 1.

In a manufacturing method of a semiconductor device according to an embodiment of the present invention, the peak positions of the stress distribution on the side of the source region 19 and the drain region 20 occur inward of the end portions of the gate electrode with respect to the gate length direction between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase carrier velocity and thus improve saturation current characteristics.

The increased carrier amount injected into the channel region 12 increases the carrier velocity, and thus improves the driving capability of the transistor. Thus, the effect of improving characteristics by the applied stress to the channel region 12 can be maximized. The same effect can be advantageously expected also for an n-channel type semiconductor device.

Second Exemplary Manufacturing Method of Semiconductor Device

A second exemplary manufacturing method of a semiconductor device according to Second Embodiment of the present invention is described below with reference the manufacturing step cross sectional views of FIG. 7. The manufacturing method is an exemplary manufacturing method of the semiconductor device 2 of the foregoing second example.

As illustrated in (1) in FIG. 7, a dummy pattern 41 is removed to form a depression 50 according to the first exemplary manufacturing method of a semiconductor device described with reference to (1) in FIG. 4 to (8) in FIG. 6. The depression 50 has a width of 40 nm to 60 nm. Then, a side-wall insulating film forming film 52 is formed on the inner surfaces of the depression 50. The side-wall insulating film forming film 52 is also formed on elements including the interlayer insulating film 24, the second stress-introducing layer 23, the second side-wall insulating film 18, and the first side-wall insulating film 15. The side-wall insulating film forming film 52 is formed in a thickness of 2 nm to 6 nm.

Further, the side-wall insulating film forming film 52 is formed of, for example, $SiO_2$, TEOS, NSG, or silicon nitride, using, for example, a chemical vapor deposition (CVD) method. The width of the depression 50 and the thickness of the side-wall insulating film forming film 52 are adjustable according to the stress applied to the channel region 12, and are not limited to those exemplified in this example.

Next, as illustrated in (2) in FIG. 7, the side-wall insulating film forming film 52 is etched back by dry etching to form a third side-wall insulating film 25 from the remains of the side-wall insulating film forming film 52 on the side surfaces of the depression 50. This defines the region of the depression 50.

Thereafter, as illustrated in (3) in FIG. 7, a gate insulating film 13 is formed on the inner surfaces of the depression 50. Here, the gate insulating film 13 is also formed on elements including the interlayer insulating film 24, the second stress-introducing layer 23, the second side-wall insulating film 18, and the first side-wall insulating film 15. This is followed by formation of a gate electrode forming film 51, filling the depression 50. Here, the gate electrode forming film 51 is also formed on the gate insulating film 13 residing on elements including the interlayer insulating film 24 and the second stress-introducing layer 23.

The excess films, including the excess portions of the gate electrode forming film 51 and the gate insulating film 13 are then removed by chemical mechanical polishing (CMP) to form a gate electrode 14 in the depression 50 via the gate insulating film 13.

The gate insulating film 13 is formed of a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Silicon oxide ($SiO_2$) or silicon oxynitride (SiON) also can be used. The thickness is about 1 nm to about 3 nm. The deposition method may be, for example, atomic layer deposition (ALD) or chemical vapor deposition (CVD). When using silicon oxide, a thermal oxidation method may be used. Further, these may be laminated to form the film. In this example, hafnium oxide ($HfO_2$) is used.

The gate electrode 14 is formed of titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru) or indium (Ir). The deposition method may be, for example, ALD, physical vapor deposition (PVD), or chemical vapor deposition (CVD). In this example, a titanium nitride (TiN) film is deposited using PVD.

Further, the gate insulating film 13 and the gate electrode 14 formed as monolayer films in this example may be laminates of different material layers.

Chemical mechanical polishing (CMP) is used for the removal of the gate electrode 14 and the gate insulating film 13 formed on elements including the second stress-introducing layer 23 and the interlayer insulating film 24.

Though not described in this example, a wiring interlayer insulating film is subsequently formed on elements including the gate electrode 14, the second stress-introducing layer 23, and the interlayer insulating film 24. The gate electrode 14 and the silicide layer 22 are then connected to a wiring layer to enable a supply of potential through the wiring layer.

When the gate electrode 14 is formed of polycrystalline silicon, there are cases where a silicide layer is formed on the gate electrode 14. In this way, the peak of the stress distribution of the applied stress to the channel region 12 will be positioned inward of the peak of the carrier concentration distribution in the source-side extension region 16, and, at a position about 15 nm inward from the end portion of the gate electrode 14 with respect to the gate length direction, overlaps with the peak of the potential distribution that occurs in the vicinity of the source-side extension region 16.

This completes the formation of the semiconductor device 2.

Because of the third side-wall insulating film 25 formed in the manufacturing method of the semiconductor device 2, the overlap capacitance between the gate electrode 14 and the source- and drain-side extension regions 16 and 17 can be reduced more than in the semiconductor device 1 of the first example.

In the presently described manufacturing method of a semiconductor device, the peak positions of the stress distribution on the side of the source region 19 and the drain region 20 occur inward of the end portions of the gate electrode with respect to the gate length direction between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase carrier velocity and thus improve saturation current characteristics.

The increased carrier amount injected into the channel region 12 increases the carrier velocity, and thus improves the driving capability of the transistor. Thus, the effect of improving characteristics by the applied stress to the channel region 12 can be maximized. The same effect can be advantageously expected also for an n-channel type semiconductor device.

Third Exemplary Manufacturing Method of Semiconductor Device

A third exemplary manufacturing method of a semiconductor device according to Second Embodiment of the present invention is described below with reference to the manufacturing step cross sectional views of FIG. 8 to FIG. 9. The manufacturing method is an exemplary manufacturing method of the semiconductor device 3 of the foregoing third example.

Figure 8:
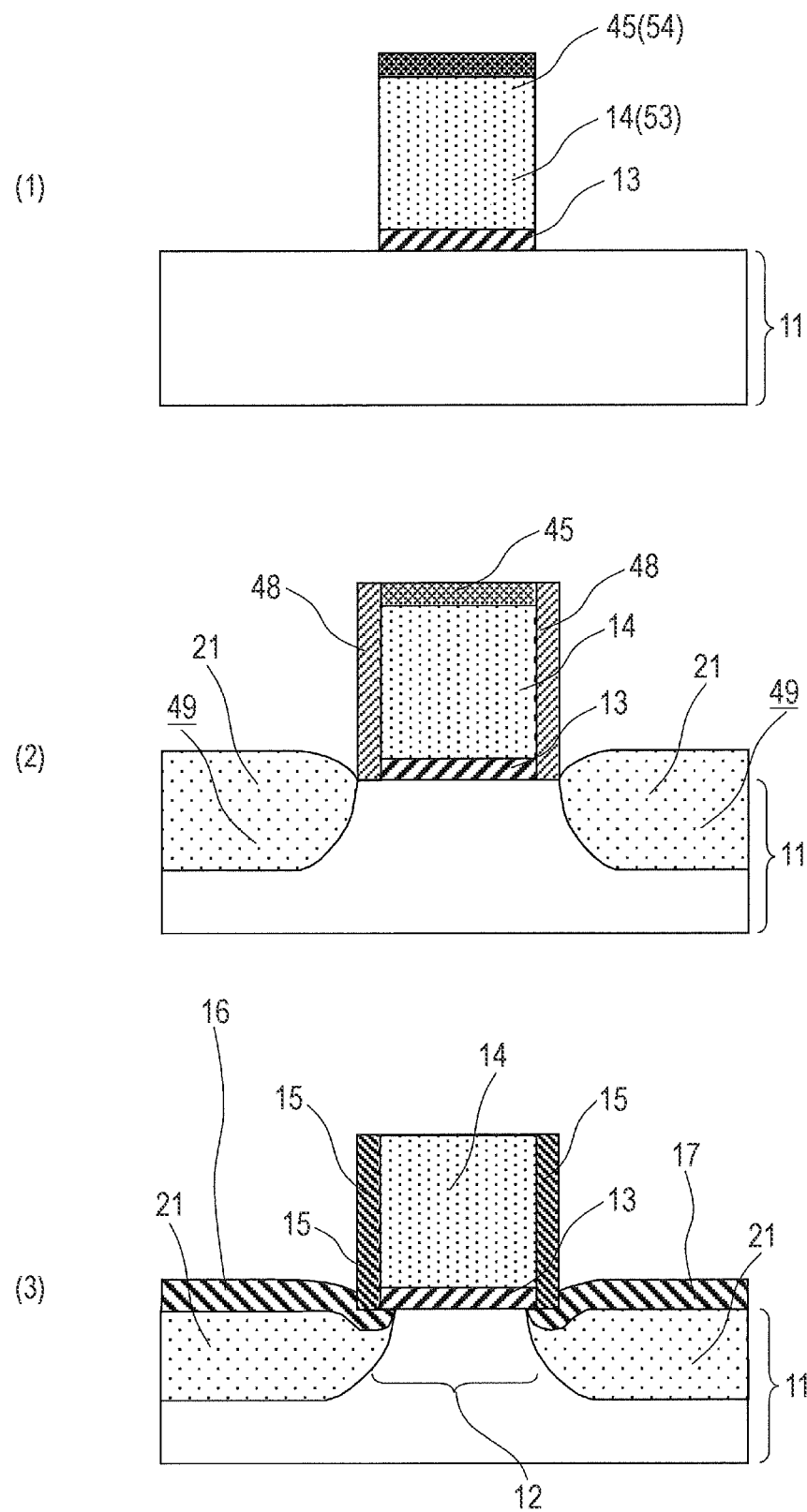
FIG. 8 is a manufacturing step cross sectional view illustrating a third exemplary manufacturing method of a semiconductor device according to Second Embodiment of the present invention.

As illustrated in (1) in FIG. 8, a gate insulating film 13, a gate electrode film 53, and a hard mask film 54 are formed on a semiconductor substrate 11. Though not illustrated, prior to forming the gate insulating film 14, a well region may be formed by introducing impurities using an ion implantation method after forming an element isolation region in the semiconductor substrate 11.

The gate insulating film 14 is formed of a high dielectric (High-k) film such as hafnium oxide ($HfO_2$), hafnium aluminum oxide ($HfAlO_2$), hafnium silicon oxide (HfSiO), tantalum oxide ($Ta_2O_5$), aluminum oxide ($Al_2O_3$), and zirconium oxide ($ZrO_2$). Silicon oxide ($SiO_2$) or silicon oxynitride (SiON) also can be used. The gate insulating film 14 is formed in a thickness of, for example, about 1 nm to about 3 nm. The deposition method may be, for example, atomic layer deposition (ALD) or chemical vapor deposition (CVD). When using silicon oxide, a thermal oxidation method may be used. Further, these may be laminated to form the film. In this example, a silicon oxynitride film is used.

The gate electrode film 53 is formed of, for example, polycrystalline silicon, titanium nitride (TiN), titanium (Ti), titanium silicide (TiSi), nickel (Ni), nickel silicide (NiSi), hafnium (Hf), hafnium silicide (HfSi), tungsten (W), tantalum (Ta), tantalum silicide (TaSi), tantalum silicon nitride (TaSiN), cobalt (Co), cobalt silicide (CoSi), ruthenium (Ru), or indium (Ir). The deposition method may be, for example, ALD, physical vapor deposition (PVD), or chemical vapor deposition (CVD). In this example, a polycrystalline silicon film is formed using a CVD method.

Further, the gate insulating film 13 and the gate electrode film 53 formed as monolayer films in this example may be laminates of different material layers.

Thereafter, a resist pattern (not shown) is formed using a lithography technique such as photolithography and electron lithography.

Then, the hard mask film 54 is etched to form a hard mask 45 by a method such as dry etching using the resist pattern as a mask.

After removing the resist pattern, the gate electrode film 53 and the gate insulating film 13 are etched using the hard mask 45 as a mask.

Here, the gate electrode film 53 and the gate insulating film 13 may be etched without removing the resist pattern.

This completes the formation of the gate electrode 14 on the semiconductor substrate 11 via the gate insulating film 13.

Next, as illustrated in (2) in FIG. 8, a dummy side-wall insulating film 48 is formed on the side walls of elements including the gate insulating film 13, the gate electrode 14, and the hard mask 45. The dummy side-wall insulating film 48 is formed by first forming an insulating film over the whole surface of the semiconductor substrate 11, and then etching back the insulating film by a method such as dry etching so as to leave the insulating film on the side walls of elements including the gate electrode 14.

The dummy side-wall insulating film 48 is formed of, for example, a silicon nitride film, a TEOS (tetra ethyl ortho silicate) film, an NSG film, or a silicon oxide ($SiO_2$) film in a thickness of, for example, about 1 nm to about 10 nm. A CVD method is used as the deposition method, for example.

Then, the whole surface of the semiconductor substrate 11 is recess etched using a method such as dry etching. Here, the etch back is more selective for the hard mask 45 and the dummy side-wall insulating film 48 than for the semiconductor substrate 11 so that only the semiconductor substrate 11 can be etched.

When the element isolation region (not shown) is formed, it is preferable to increase the selectivity as high as possible against the material forming the element isolation region. Here, a trench 49 having a depth of about 50 nm to about 100 nm is formed in the semiconductor substrate 11.

A first stress-introducing layer 21 is then selectively formed in the trench 49. The first stress-introducing layer 21 is formed by a selective epitaxial growth method, using, for example, silicon germanium (SiGe) when introducing compression stress, and silicon carbide (SiC) when introducing tensile stress. The deposition thickness of epitaxial growth is, for example, about 50 nm to about 200 nm.

When forming a silicide electrode on the SiGe or SiC as in this example, it is preferable that a silicon layer (not shown) be laminated on the first stress-introducing layer 21 in a thickness of about 30 nm to about 50 nm.

When forming the first stress-introducing layer 21, impurities may be introduced at the same time to form source and drain regions. For example, in the case of an n-type transistor, n-type impurities are introduced. In the case of a p-type transistor, p-type impurities are introduced.

Next, as illustrated in (3) in FIG. 8, the hard mask 45 (see (2) in FIG. 8) and the dummy side-wall insulating film 48 (see (2) in FIG. 8) are removed by, for example, wet etching. Then, an insulating film is formed over the whole surface of the semiconductor substrate 11 so as to cover the gate electrode 14. The insulating film is then etched back using a method such as dry etching to form a first side-wall insulating film 15 on the side walls of the gate electrode 14 and the gate insulating film 13. The first side-wall insulating film 15 is formed of, for example, silicon nitride, TEOS, NSG, or $SiO_2$ in a thickness of, for example, about 1 nm to about 10 nm. For example, a CVD method is used as the deposition method of the insulating film used to form the first side-wall insulating film 15.

In this example, the dummy side-wall insulating film 48 is removed with the hard mask 45; however, the dummy side-wall insulating film 48 may be kept and used as the first side-wall insulating film 15.

Further, unlike the present example, there are cases where the first side-wall insulating film 15 is not formed.

Next, ion implantation is performed using elements such as the gate electrode 14, the first side-wall insulating film 15, and the element isolation region (not shown) as a mask so as to simultaneously form a source-side extension region 16 and a drain-side extension region 17 in the semiconductor substrate 11 (first stress-introducing layer 21). In the case of an n-type transistor, n-type impurities are introduced to the source-side extension region 16 and the drain-side extension region 17. In the case of a p-type transistor, p-type impurities are introduced.

Prior to the transistor formation, the distribution of the applied stress to the channel region 12 is grasped, and impurities are introduced by ion implantation in such a manner that the peak of the stress distribution overlaps in position with the peak of the potential distribution that occurs in the vicinity of the source-side extension region 16. Here, the thickness of the first side-wall insulating film 15 may be adjusted.

For example, in this example, elements such as arsenic (As) are used as n-type impurities, and these impurities are implanted in a dose amount of about $7\times10^{14}$ cm$^{-2}$ to about $2\times10^{15}$ cm$^{-2}$ at an energy of 1 keV to 2 keV.

Elements such as boron fluoride ($BF_2$) are used as p-type impurities, and these impurities are implanted in a dose amount of about $8\times10^{14}$ cm$^{-2}$ to about $3\times10^{15}$ cm$^{-2}$ at an energy of 1 keV to 3 keV.

The impurities are implanted at, for example, a 0° implantation angle with respect to the semiconductor substrate 11 (perpendicular to the plane of the semiconductor substrate 11).

In some cases, impurities of the opposite conduction type from the impurities for the source-side extension region 16 and the drain-side extension region 17 are implanted more deep down past the source-side extension region 16 and the drain-side extension region 17. In this way, a steeper impurity profile can be obtained in the depth direction of the source-side extension region 16 and the drain-side extension region 17.

The ion implantation conditions to form the source-side extension region 16 and the drain-side extension region 17 need to be adjusted according to the distribution peak of the applied stress to the channel region 12, and are therefore not limited to the foregoing example. In this example, the ion implantation conditions are adjusted based on a combination of the first stress-introducing layer 21 and the second stress-introducing layer formed in a later step.

Next, as illustrated in (4) in FIG. 9, after forming an insulating film over the whole surface of the semiconductor substrate 11, a second side-wall insulating film 18 is formed on the side surfaces of the first side-wall insulating film 15 by etch back using dry etching.

The insulating film to be the second side-wall insulating film 18 is formed of, for example, a silicon nitride film, TEOS, NSG, or $SiO_2$ in a thickness of, for example, about 20 nm to about 50 nm. A CVD method is used as the deposition method, for example. The second side-wall insulating film 18, formed as a single-layer insulating film in this example, may be a laminate of multiple insulating films.

Then, a source region 19 and a drain region 20 are formed in the semiconductor substrate 11 (substantially in the first stress-introducing layer 21) by ion implantation using elements such as the gate electrode 14, the first side-wall insulating film 15, and the second side-wall insulating film 18 as a mask. Specifically, the source region 19 is formed in the semiconductor substrate 11 on one side of the gate electrode 14 via the source-side extension region 16, and the drain region 20 is formed on the other side of the gate electrode 14 via the drain-side extension region 17. The source region 19 and the drain region 20 are formed by implanting impurities of the same type as those used for the source-side extension region 16 and the drain-side extension region 17.

This is followed by annealing to activate the impurities implanted into the source-side extension region 16, the drain-side extension region 17, the source region 19, and the drain region 20. The activation causes the impurities to diffuse, and as a result the source-side extension region 16 and the drain-side extension region 17 spread over to regions underneath the end portions of the gate electrode 14 in the gate length direction. The activation annealing is performed by, for example, rapid thermal processing (RTA) at a temperature of about 1,000° C. to about 1,100° C.

The activation determines the final positions of the source-side extension region 16 and the drain-side extension region 17. As such, the annealing conditions are adjusted according to the ion implantation conditions of forming the source-side extension region 16 and the drain-side extension region 17, and the applied stress to the channel region 12.

Specifically, adjustment is made so that the peak of the stress distribution of the applied stress to the channel region 12 occurs inward of the end portions of the subsequently formed gate electrode and overlaps with the peak of the potential distribution in the vicinity of the source-side extension region 16.

Then, a silicide layer 22 (22S, 22D) is formed on the source region 19 and the drain region 20 using a salicide process technique. The silicide layer 22 is formed by, for example, silicidation of titanium (Ti), cobalt (Co), nickel (Ni), platinum (Pt), or a compound thereof in a thickness of, for example, about 20 nm to about 70 nm.

Because polycrystalline silicon is used for the uppermost layer of the gate electrode 14 in this example, the silicide layer 22 is also formed on the gate electrode 14.

However, when using a metal film or a metal alloy film for the gate electrode 14, the silicide layer 22 may not be formed on the gate electrode 14.

Then, as illustrated in (5) in FIG. 9, a second stress-introducing layer 23 and an interlayer insulating film 24 are formed over the whole surface of the semiconductor substrate 11 so as to cover elements such as the gate electrode 14, the source region 19, and the drain region 20, including the silicide layer 22.

The second stress-introducing layer 23 is formed of a film having a tensile stress or a compression stress of about 1.5 GPa to about 2.2 GPa. For example, a silicon nitride film having a thickness of about 30 nm to about 70 nm is formed.

The interlayer insulating film 24 is formed of, for example, TEOS or NSG. To enhance stress, the interlayer insulating film 24 may be formed of the same material used for the second stress-introducing layer 23.

Thereafter, as illustrated in (6) in FIG. 9, the surface of the interlayer insulating film 24 is planarized by, for example, chemical mechanical polishing (CMP). In this state, the second stress-introducing layer 23 has a continuous structure covering the silicide layer 22 on the source region 19, the second side-wall insulating film 18 and the gate electrode 14, and the silicide layer 22 on the drain region 20.

Though not illustrated, a wiring layer is connected to the gate electrode 14 and the silicide layer 22 to enable a supply of potential through the wiring layer.

In this way, the peak of the stress distribution of the applied stress to the channel region 12 will be positioned inward of the peak of the carrier concentration distribution in the source-side extension region 16, and, at a position about 15 nm inward from the end portion of the gate electrode 14 with respect to the gate length direction, overlaps with the peak of the potential distribution that occurs in the vicinity of the source-side extension region 16.

This completes the formation of the semiconductor device 3.

In the presently described manufacturing method of a semiconductor device, the peak positions of the stress distribution on the side of the source region 19 and the drain region 20 occur between the impurity boundary (pn junction boundary) of the channel region 12 and the source region 19 and the impurity boundary (pn junction boundary) of the channel region 12 and the drain region 20. This enables the peak of the stress distribution of the applied stress to the channel region 12 to overlap with the peak of the potential distribution in the vicinity of the source region 19 (source-side extension region 16), making it possible to increase carrier velocity and thus improve saturation current characteristics.

The increased carrier amount injected into the channel region 12 increases the carrier velocity, and thus improves the driving capability of the transistor. Thus, the effect of improving characteristics by the applied stress to the channel region 12 can be maximized. The same effect can be advantageously expected also for an n-channel type semiconductor device.

Figure 10:
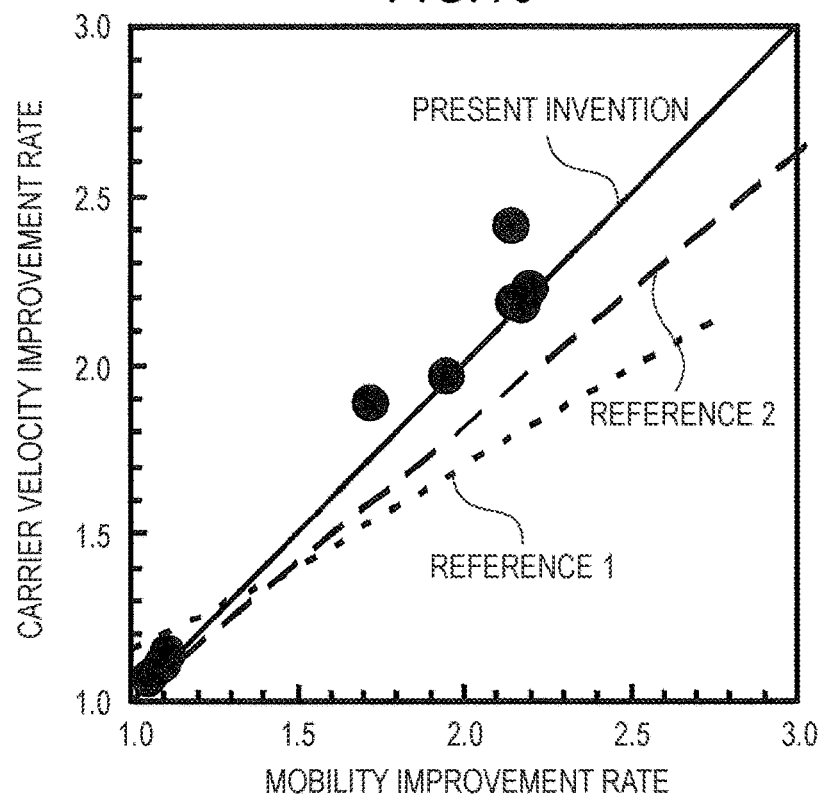
FIG. 10 is a graph representing a relationship between carrier mobility improvement rate and carrier velocity improvement rate in a semiconductor device.
Figure 11:
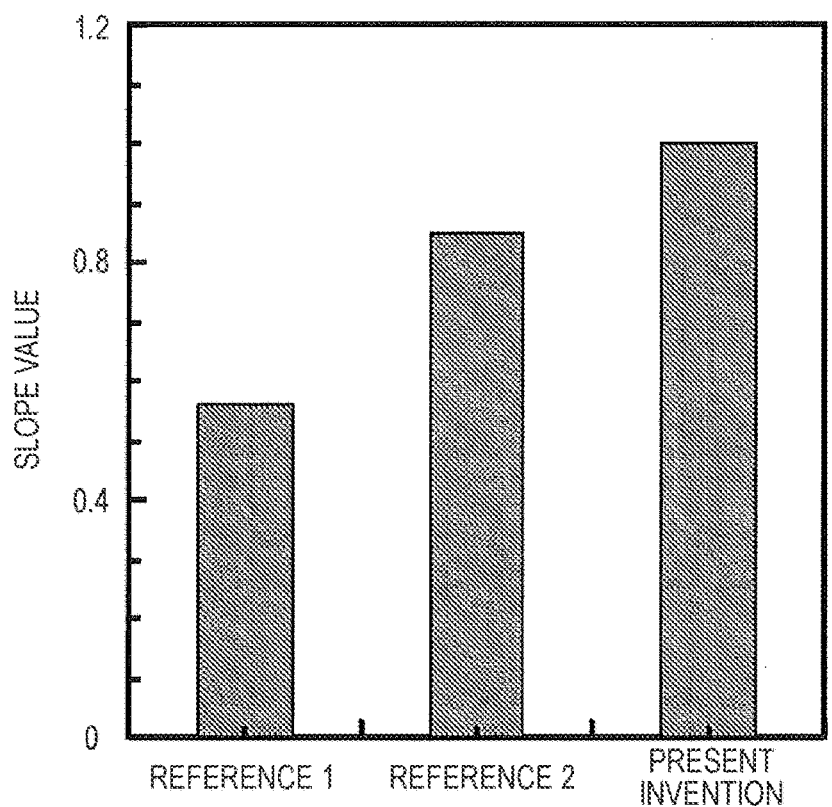
FIG. 11 is a chart representing values of the slopes plotted in FIG. 10.

FIG. 10 and FIG. 11 represent the results of experiment on the effects of the semiconductor device 1 of the foregoing first example formed as a pFET.

FIG. 10 represents a relationship between the carrier mobility improvement rate and the carrier velocity improvement rate in the semiconductor device 1 under applied stress to the channel region 12.

FIG. 11 represents values of the slopes plotted in FIG. 10.

Figure 13:
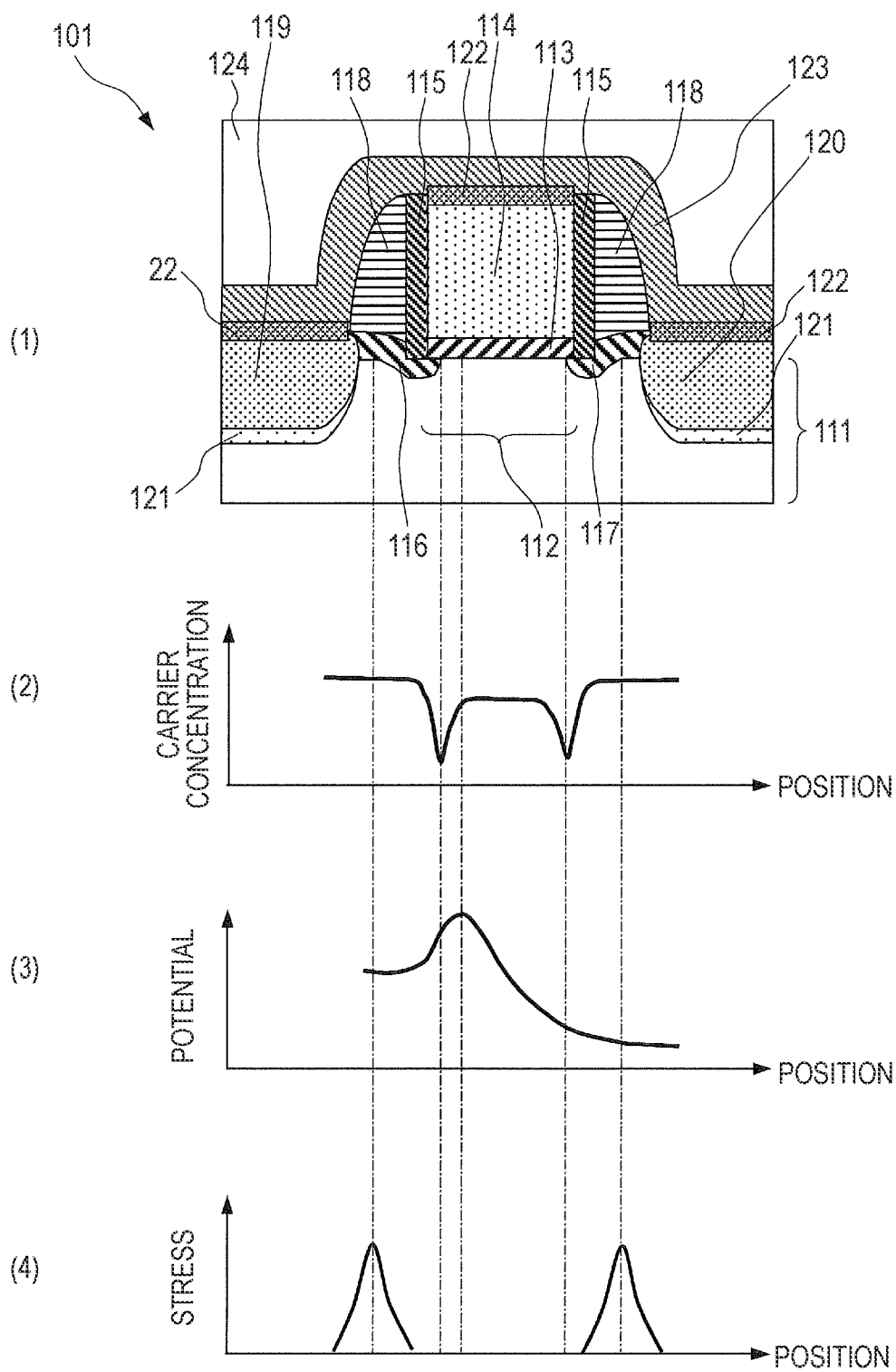
FIG. 13 is a view illustrating a semiconductor device of related art.

Reference 1 and Reference 2 indicate the results from semiconductor devices fabricated using the technique of the related art described with reference to FIG. 13.

Reference 1: L. Washington et al., *pMOSFET with 200 Mobility enhancement Induced by Multiple stressors*, Electron Device Letters, vol. 27-6, pp. 511 (2006).

Reference 2: A. Khakifirooz et al., *Transistor Performance Scaling: The Role of Virtual Source Velocity and Its Mobility Dependence*, IEDM Tech. Dig., pp. 667 (2006).

As represented in FIG. 10 and FIG. 11, the slope of carrier velocity improvement rate is greater in the semiconductor device 1 of the first example than in the semiconductor devices of References 1 and 2.

This indicates that the semiconductor device 1 of the first example has a greater carrier velocity improvement rate against the mobility improvement rate due to the applied stress to the channel. The carrier velocity is improved because of the overlapping peak positions between the peak of the stress distribution of the applied stress to the channel region 12 and the peak of the potential distribution in the vicinity of the source-side extension region 16. The improved carrier velocity improves the saturation current characteristics.

The effects of the semiconductor devices 2 and 3 of the foregoing second and third examples are described below with reference to FIG. 12.

FIG. 12 represents the simulation results of the distribution of the applied stress to the channel region 12 from the first stress-introducing layer 21 and the second stress-introducing layer 23 in the semiconductor devices 2 and 3 formed as pFETs.

A compression strain film is used for the first stress-introducing layer 21 and the second stress-introducing layer 23, and accordingly compression stress is applied to the channel region 12.

(1) in FIG. 12 represents the result with the gate electrode 14 being formed in the depression 50 formed by using the dummy gate pattern 41 as in the first example.

In this case, the peaks of the stress distribution of the applied stress to the channel region 12 from the stress-introducing layer (first stress-introducing layer 21, and second stress-introducing layer 23) are positioned about 100 nm inward of the end portions of the gate electrode 14 (toward the gate electrode 14).

Thus, by adjusting the thickness of the third side-wall insulating film 25 as in the semiconductor device 2 of the second example, the peaks of the stress distribution can be positioned more inwardly from the regions underneath the end portions of the gate electrode 14 while reducing the gate length of the gate electrode 14.

(2) in FIG. 12 represents the calculation result of a simulation on the semiconductor device 3 of the third example. By the structure in which the first stress-introducing layer 21 is brought closer to the end portions of the gate electrode 14, the peaks of the stress distribution can occur inward of the end portions of the gate electrode 14.

These results show that the peaks of the stress distribution can be formed inward of the impurity boundaries (pn junction boundaries) between the channel region 12 and the source- and drain-side extension regions 16 and 17 as in the semiconductor devices 2 and 3 illustrated in FIG. 2 and FIG. 3, making it possible to overlap the peak of the potential distribution in the vicinity of the source-side extension region 16 with the peak of the stress distribution of the applied stress to the channel region 12.

The present application contains subject matter related to that disclosed in Japanese Priority Patent Application JP 2009-140930 filed in the Japan Patent Office on Jun. 12, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a semiconductor substrate with a surface;
a channel region in the semiconductor substrate;
a gate electrode over the channel region and the surface of the semiconductor substrate;
a gate insulating film between the gate electrode and the channel region;
recesses in the surface on opposite sides of the gate electrode;
a first stress-introducing layer in the recesses to apply stress to the channel region,
a source region in the first stress-introducing layer at a source side of the channel region and a drain region in the first stress-introducing layer at a drain side of the channel region;
in a cross section, sidewalls flanking the gate electrode;
in the cross section, a source extension region extending from the source region to under the gate electrode and partially residing on the first stress-introducing layer, and a drain extension region extending from the drain region to under the gate electrode and partially residing on the first stress-introducing layer;
a second stress-introducing layer over the source region and the drain region, the second stress-introducing layer being a film with upper and lower surfaces that conform to outer surfaces of the sidewalls and a surface above the source and drain regions; and
an interlayer insulating layer over the second stress-introducing layer,
wherein,
a width of a bottom portion of the gate electrode proximate to the semiconductor substrate is smaller than a width of an upper portion of the gate electrode distal to the semiconductor substrate,
in the cross section, the source extension region and the drain extension region extend to underneath the bottom portion of the gate electrode,
in the cross section, peaks of a stress distribution of a stress applied to the channel region by the first stress-introducing layer and the second stress-introducing layer are between ends of the gate electrode in a gate length direction.

2. The semiconductor device of claim 1, wherein the gate electrode includes at least one metal material.

3. The semiconductor device of claim 2, wherein the second stress-introducing layer is formed at opposite sides of the gate electrode without contacting the gate electrode, and not formed on the gate electrode.

4. The semiconductor device of claim 3, wherein the gate insulating film comprises at least one selected from the group consisting of HfO, HfAlO, HfSiO, TaO, and ZrO.

5. The semiconductor device of claim 4, wherein the gate electrode comprises at least one selected from the group consisting of TiSi, Ni, NiSi, Hf, HfSi, W, Ta, TaSi, TaSiN, Co, CoSi, Ru, and Ir.

6. The semiconductor device of claim 5, wherein the sidewalls comprise:
a first side-wall insulating film within which is embedded the gate electrode;
a second side-wall insulating film between the second stress-introducing layer and the gate electrode; and
a third side-wall insulating film between the second stress-introducing layer and the second side-wall insulating film,
wherein,
the first side-wall insulating film is between the second side-wall insulating film and the gate electrode.

7. The semiconductor device claim 6, wherein the second side-wall insulating film comprises SiO.

8. The semiconductor device claim 7, wherein the third side-wall insulating film comprises SiN.

9. The semiconductor device claim 8, wherein the first side-wall insulating film comprises SiO.

10. The semiconductor device claim 9, wherein a thickness of the second side-wall insulating film is 2 nm to 10 nm.

11. The semiconductor device claim 10, wherein a thickness of the third side-wall insulating film is 20 nm to 100 nm.

12. The semiconductor device claim 10, wherein a thickness of the first side-wall insulating film is 2 nm to 6 nm.

13. The semiconductor device of claim 3, wherein a thickness of the gate insulating film is 1 nm to 3 nm.

14. The semiconductor device of claim 1, wherein, the source region-side and drain region-side stress distribution peaks are positioned between a pn junction boundary of the channel region and the source region and a pn junction boundary of the channel region and the drain region.

15. The semiconductor device of claim 1, a peak of a potential distribution in a vicinity of the source extension region overlaps with one of the peaks of the stress distribution of stress applied to the channel by the first stress-introducing layer and the second stress-introducing layer.

16. The semiconductor device of claim 1, wherein the second stress-introducing layer as a thickness of 30 nm to 70 nm.

17. A semiconductor device comprising:
a semiconductor substrate with a surface;
a channel region in the semiconductor substrate;
a gate electrode over the channel region and the surface of the semiconductor substrate;
a gate insulating film between the gate electrode and the channel region;
recesses in the surface on opposite sides of the gate electrode;
a first stress-introducing layer in the recesses to apply stress to the channel region,
a source region in the first stress-introducing layer at a source side of the channel region and a drain region in the first stress-introducing layer at a drain side of the channel region;
in a cross section, a source extension region extending from the source region to under the gate electrode and partially residing on the first stress-introducing layer, and a drain extension region extending from the drain region to under the gate electrode and partially residing on the first stress-introducing layer;
a second stress-introducing layer over the source region and the drain region;
a first side-wall insulating film within which is embedded the gate electrode;
a second side-wall insulating film between the second stress-introducing layer and the gate electrode; and
a third side-wall insulating film between the second stress-introducing layer and the second side-wall insulating film,
wherein,
in the cross section, peaks of a stress distribution of a stress applied to the channel region by the first stress-introducing layer and the second stress-introducing layer are between ends of the gate electrode in a gate length direction,
the gate electrode includes at least one metal material,
the gate electrode comprises at least one selected from the group consisting of TiSi, Ni, NiSi, Hf, HfSi, W, Ta, TaSi, TaSiN, Co, CoSi, Ru, and Ir
the second stress-introducing layer is formed at opposite sides of the gate electrode without contacting the gate electrode, and not formed on the gate electrode, the gate insulating film comprises at least one selected from the group consisting of HfO, HfAlO, HfSiO, TaO, and ZrO,
the first side-wall insulating film is between the second side-wall insulating film and the gate electrode,
each of the first side-wall insulating film and the second side-wall insulating film comprises SiO,
the third side-wall insulating film comprises SiN,
a thickness of the second side-wall insulating film is 2 nm to 10 nm,
a thickness of the first side-wall insulating film is 2 nm to 6 nm, and
the gate insulating film is between the gate electrode and the first side-wall insulating film, the gate insulating film having a curved shape aligned with the second side of the first side-wall insulating film.

18. The semiconductor device of claim 17, further comprising source and drain extension regions that extend to underneath the gate electrode.

19. A semiconductor device comprising:
a semiconductor substrate with a surface;
a channel region in the semiconductor substrate;
a gate electrode over the channel region and the surface of the semiconductor substrate;
a gate insulating film between the gate electrode and the channel region;
recesses in the surface on opposite sides of the gate electrode;
a first stress-introducing layer in the recesses to apply stress to the channel region,
a source region in the first stress-introducing layer at a source side of the channel region and a drain region in the first stress-introducing layer at a drain side of the channel region;
in a cross section, a source extension region extending from the source region to under the gate electrode and partially residing on the first stress-introducing layer, and a drain extension region extending from the drain region to under the gate electrode and partially residing on the first stress-introducing layer;
a second stress-introducing layer over the source region and the drain region;
a first side-wall insulating film within which is embedded the gate electrode;
a second side-wall insulating film between the second stress-introducing layer and the gate electrode; and
a third side-wall insulating film between the second stress-introducing layer and the second side-wall insulating film,
wherein,
in the cross section, peaks of a stress distribution of a stress applied to the channel region by the first stress-introducing layer and the second stress-introducing layer are between ends of the gate electrode in a gate length direction,
the gate electrode includes at least one metal material,
the gate electrode comprises at least one selected from the group consisting of TiSi, Ni, NiSi, Hf, HfSi, W, Ta, TaSi, TaSiN, Co, CoSi, Ru, and Ir
the second stress-introducing layer is formed at opposite sides of the gate electrode without contacting the gate electrode, and not formed on the gate electrode,
the gate insulating film comprises at least one selected from the group consisting of HfO, HfAlO, HfSiO, TaO, and ZrO,
the first side-wall insulating film is between the second side-wall insulating film and the gate electrode, each of the first side-wall insulating film and the second side-wall insulating film comprises SiO,
the third side-wall insulating film comprises SiN,
a thickness of the second side-wall insulating film is 2 nm to 10 nm,
a thickness of the first side-wall insulating film is 2 nm to 6 nm, and
the gate insulating film is between the gate electrode and the first side-wall insulating film, the gate insulating film having a curved shape aligned with the second side of the first side-wall insulating film.

20. A semiconductor device comprising:
a semiconductor substrate with a surface;
a channel region in the semiconductor substrate;
a gate electrode over the channel region and the surface of the semiconductor substrate;
a gate insulating film between the gate electrode and the channel region;
recesses in the surface on opposite sides of the gate electrode;
a first stress-introducing layer in the recesses to apply stress to the channel region,
a source region in the first stress-introducing layer at a source side of the channel region and a drain region in the first stress-introducing layer at a drain side of the channel region;
in a cross section, a source extension region extending from the source region to under the gate electrode and partially residing on the first stress-introducing layer, and a drain extension region extending from the drain region to under the gate electrode and partially residing on the first stress-introducing layer;
a second stress-introducing layer over the source region and the drain region;
a first side-wall insulating film within which is embedded the gate electrode;
a second side-wall insulating film between the second stress-introducing layer and the gate electrode; and
a third side-wall insulating film between the second stress-introducing layer and the second side-wall insulating film,
wherein,
in the cross section, peaks of a stress distribution of a stress applied to the channel region by the first stress-introducing layer and the second stress-introducing layer are between ends of the gate electrode in a gate length direction,
the gate electrode includes at least one metal material,
the gate electrode comprises at least one selected from the group consisting of TiSi, Ni, NiSi, Hf, HfSi, W, Ta, TaSi, TaSiN, Co, CoSi, Ru, and Ir
the second stress-introducing layer is formed at opposite sides of the gate electrode without contacting the gate electrode, and not formed on the gate electrode,
the gate insulating film comprises at least one selected from the group consisting of HfO, HfAlO, HfSiO, TaO, and ZrO,
the first side-wall insulating film is between the second side-wall insulating film and the gate electrode,
each of the first side-wall insulating film and the second side-wall insulating film comprises SiO,
the third side-wall insulating film comprises SiN,
a thickness of the second side-wall insulating film is 2 nm to 10 nm,
a thickness of the first side-wall insulating film is 2 nm to 6 nm, and
a width of a bottom portion of the gate electrode proximate to the semiconductor substrate is smaller than a width of an upper portion of the gate electrode.

* * * * *